(12) United States Patent
Cheung et al.

(10) Patent No.: US 11,507,135 B2
(45) Date of Patent: Nov. 22, 2022

(54) MOLECULAR SCRIVENER FOR READING OR WRITING DATA TO A MACROMOLECULE

(71) Applicant: Government of the United States of America, as represented by the Secretary of Commerce, Gaithersburg, MD (US)

(72) Inventors: Kin P Cheung, Rockville, MD (US); Joseph W Robertson, Washington, DC (US); John J Kasianowicz, Darnestown, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 891 days.

(21) Appl. No.: 16/383,707

(22) Filed: Apr. 15, 2019

(65) Prior Publication Data

US 2020/0326748 A1    Oct. 15, 2020

(51) Int. Cl.
*G11C 13/00* (2006.01)
*G06F 1/16* (2006.01)
*B82Y 35/00* (2011.01)

(52) U.S. Cl.
CPC ............ *G06F 1/1613* (2013.01); *B82Y 35/00* (2013.01); *G11C 13/0016* (2013.01); *G11C 13/0019* (2013.01)

(58) Field of Classification Search
CPC ... G06F 1/1613; B82Y 35/00; G11C 13/0016; G11C 13/0019; G11C 13/004; G11C 13/0069

See application file for complete search history.

(56) References Cited

U.S. PATENT DOCUMENTS

| 2014/0174927 A1* | 6/2014 | Bashir ................. C12Q 1/6827 204/603 |
| 2019/0004029 A1* | 1/2019 | Branton ................ B01D 71/74 |
| 2019/0383788 A1* | 12/2019 | Predki ................. C12Q 1/6869 |

FOREIGN PATENT DOCUMENTS

EP    3385992 A1    10/2018

OTHER PUBLICATIONS

Schneider, G., et al., "DNA Translocation through Graphene Nanopores", Nano Letters, 2010, p. 3163-3167, vol. 10.

(Continued)

*Primary Examiner* — Xiaochun L Chen
(74) *Attorney, Agent, or Firm* — Office of Chief Counsel for National Institute of Standards and Technology

(57) ABSTRACT

A molecular scrivener reads data from or writes data to a macromolecule and includes: a pair of shielding electrodes; a scrivener electrode between the first and second shielding electrodes and that electrically floats at a third potential that, in an absence of a charged or dipolar moiety of the macromolecule, is intermediate between the first and second potentials and changes in a presence of the charged or dipolar moiety; a dielectric layer interposed between shielding electrodes and the scrivener electrode; and a nanopore that communicates the macromolecule through the electrodes and dielectric layers. Reading data from or writing data to a macromolecule includes: sequentially receiving, at the scrivener electrode, individual moieties of the macromolecule so that the third potential responds to individual moieties; communicating the macromolecule from the scrivener electrode to the second shielding electrode and from second shielding electrode to expel the macromolecule from the nanopore.

20 Claims, 31 Drawing Sheets

(56) References Cited

OTHER PUBLICATIONS

Nam, S-W., et al., "Ionic Field Effect Transistors with Sub-10 nm Multiple Nanopores", Nano Letters, 2009, p. 2044-2048, vol. 9 No. 5.

* cited by examiner

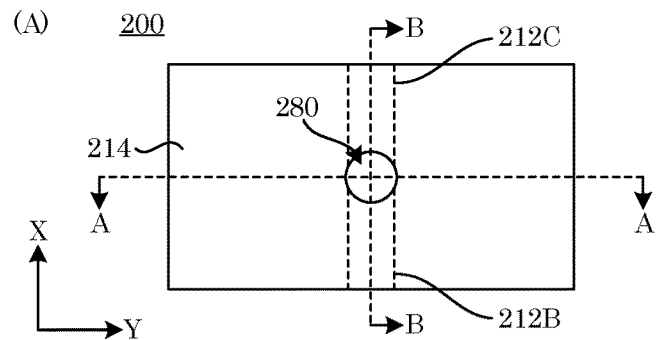
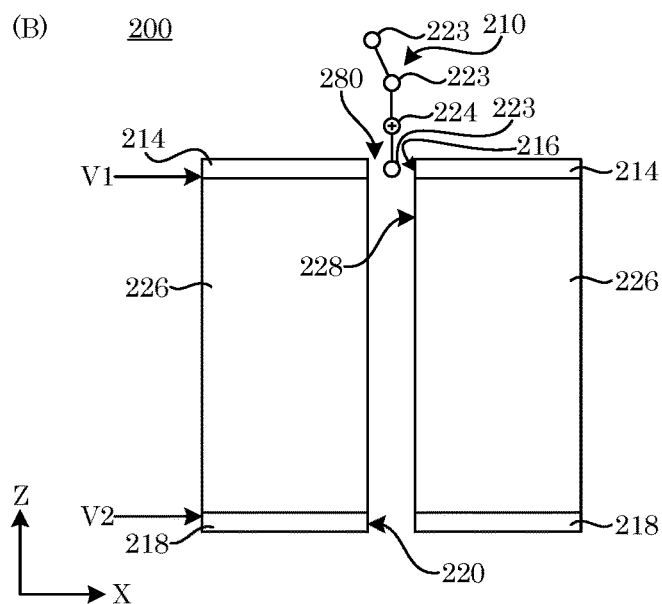
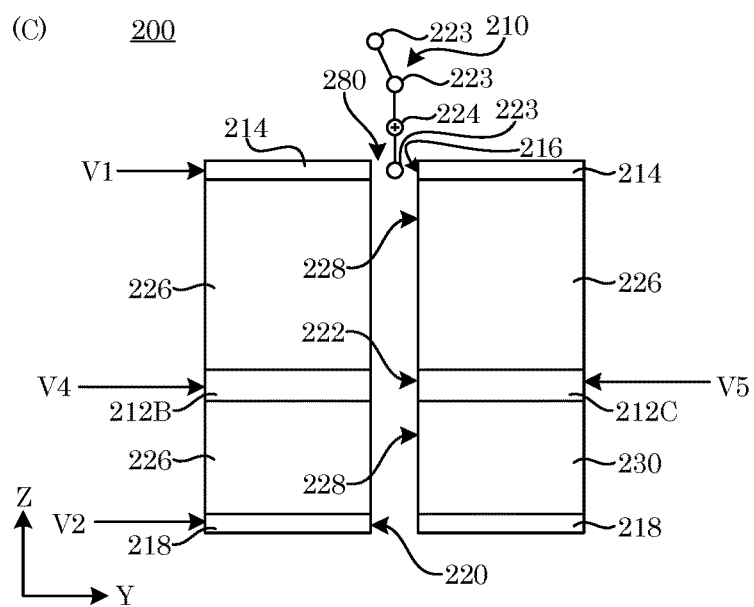
FIG. 6

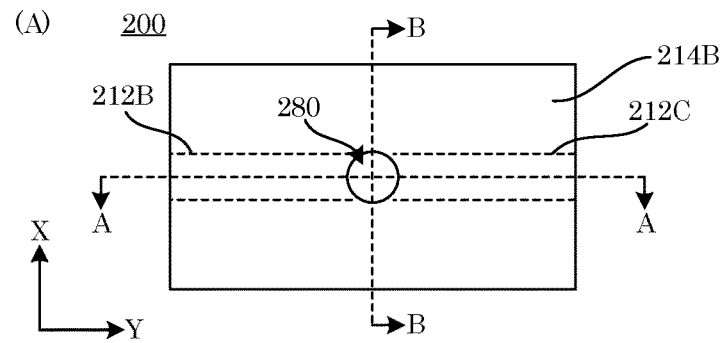
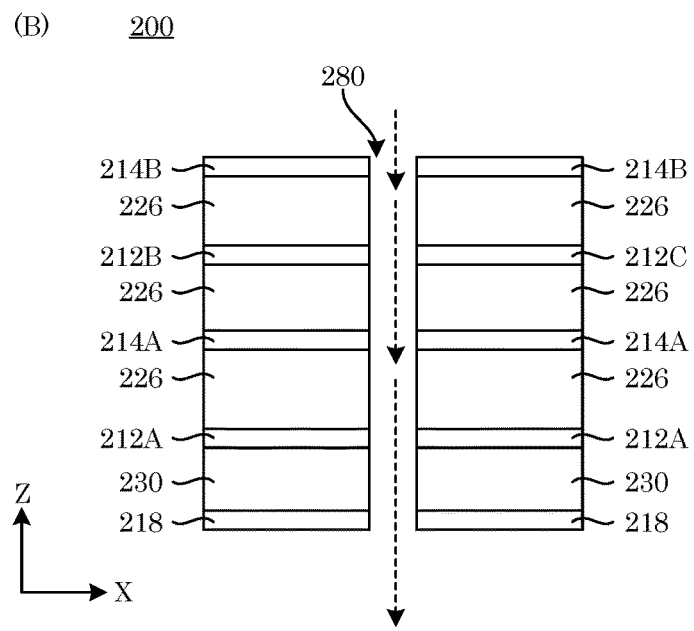
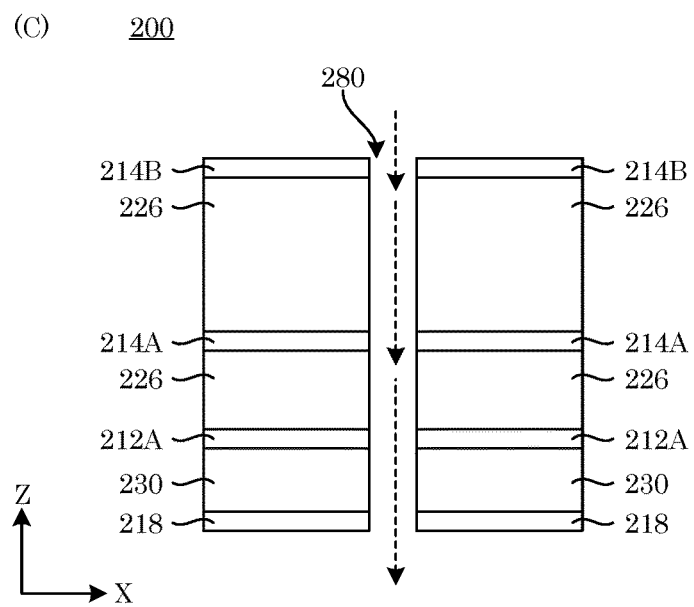
FIG. 11

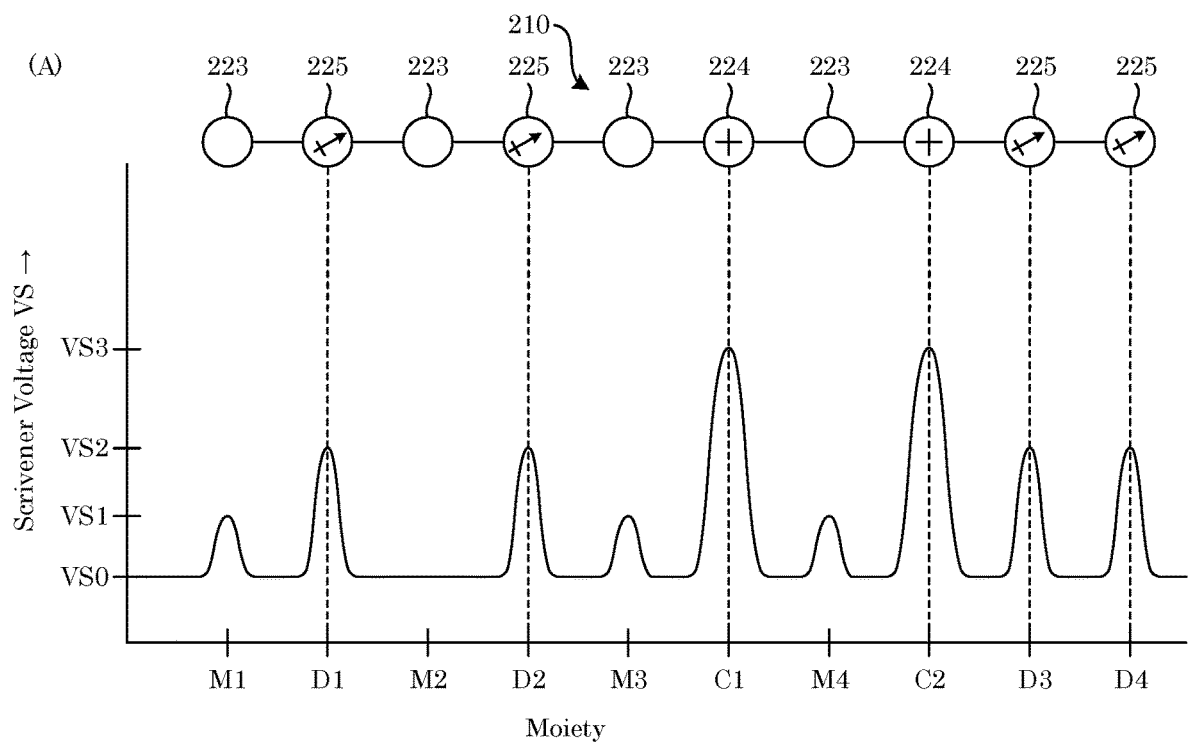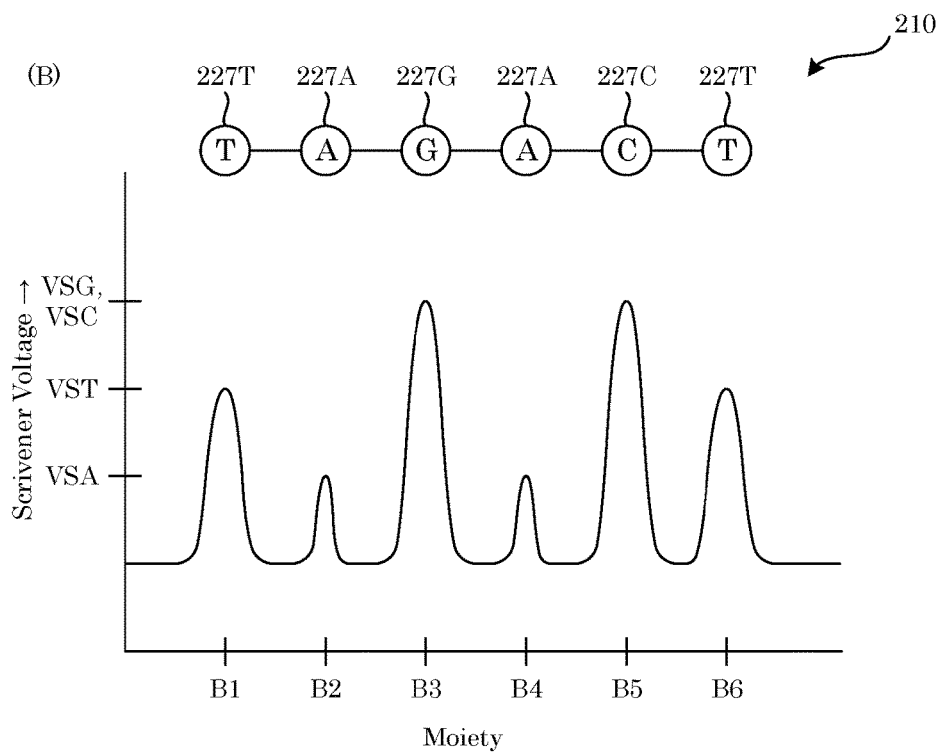
FIG. 30

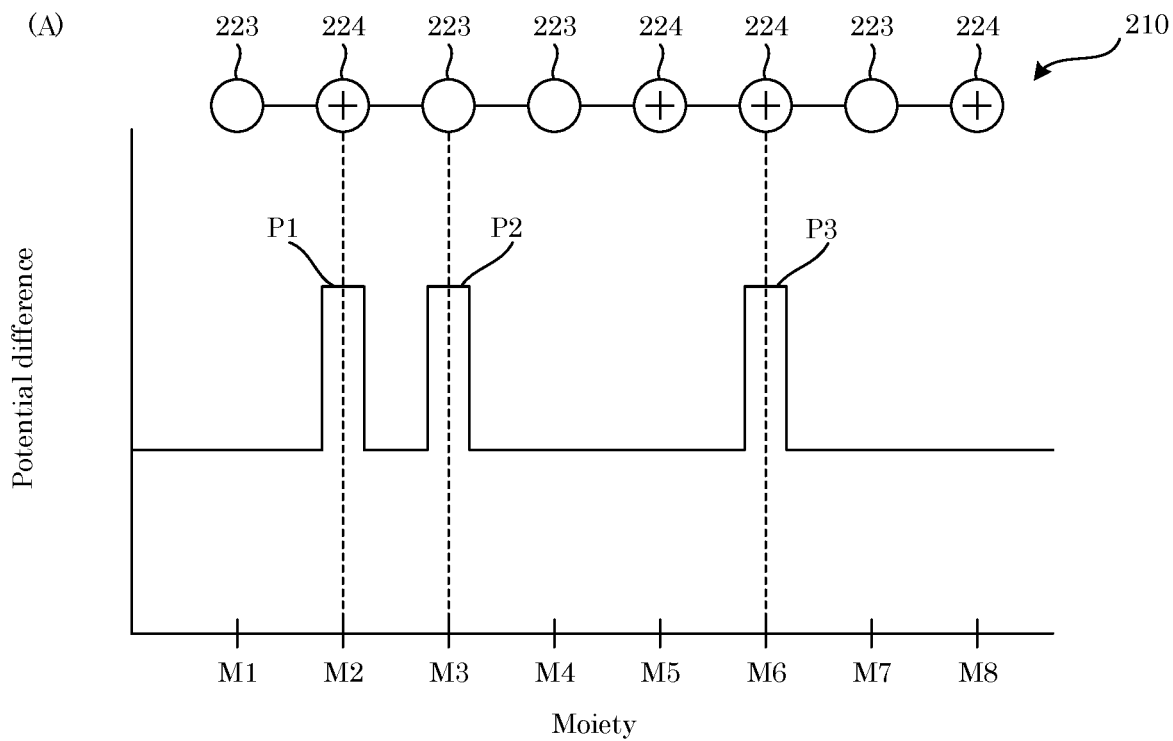
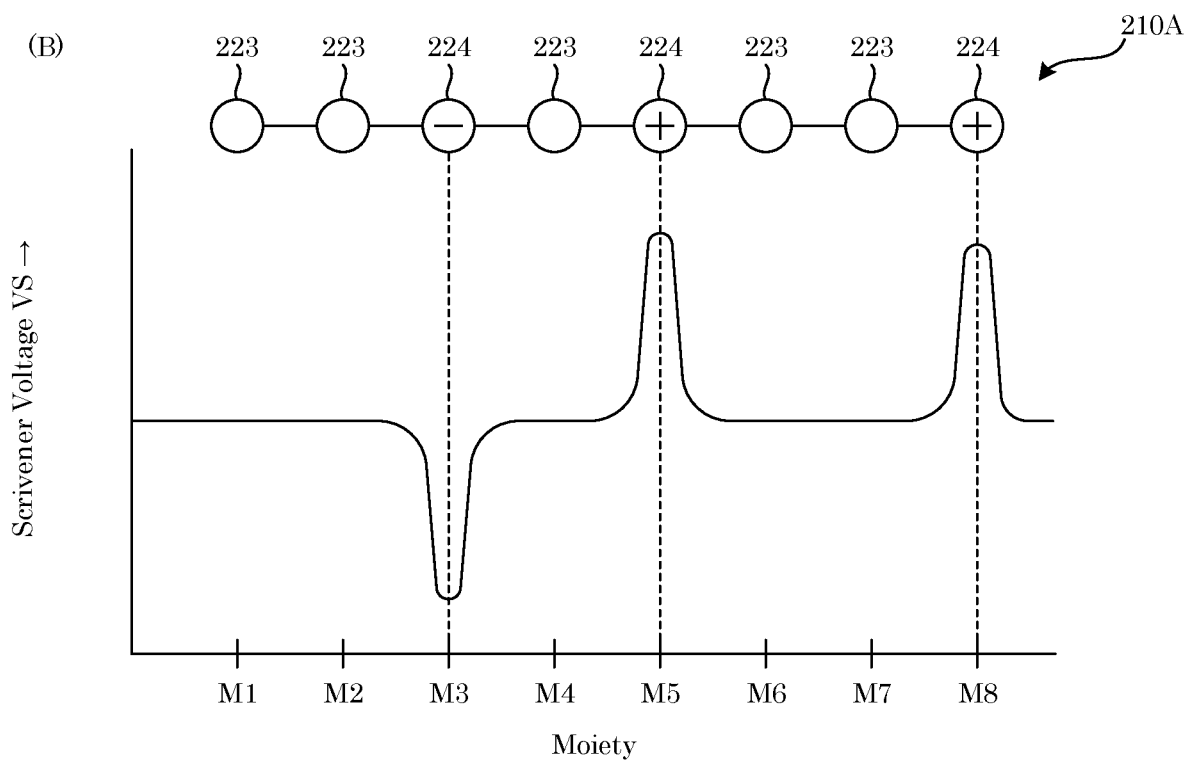
FIG. 31

MOLECULAR SCRIVENER FOR READING OR WRITING DATA TO A MACROMOLECULE

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov.

BRIEF DESCRIPTION

Disclosed is a molecular scrivener for reading data from or writing data to a macromolecule, the molecular scrivener comprising: a pair of shielding electrodes comprising: a first shielding electrode comprising a first transmission aperture bounded by the first shielding electrode and that: receives a first potential; and receives and communicates the macromolecule through the first transmission aperture in presence of the first potential; and a second shielding electrode comprising a second transmission aperture bounded by the second shielding electrode and that: receives a second potential; and receives and communicates the macromolecule through the second transmission aperture, the second transmission aperture being in fluid communication with and aligned with first transmission aperture, and the second transmission aperture being spaced apart from the first transmission aperture; a scrivener electrode comprising a third transmission aperture bounded by the scrivener electrode and that: is interposed between the first shielding electrode and the second shielding electrode; electrically floats at a third potential such that, in an absence of a charged moiety or a dipolar moiety of the macromolecule, the third potential is intermediate between the first potential and the second potential; and receives the macromolecule from the first shielding electrode; communicates the macromolecule through the second transmission aperture to the second shielding electrode; and the third potential changes in a presence of the charged moiety of the macromolecule to electrically read the presence of the charged moiety; the third potential changes in a presence of the dipolar moiety of the macromolecule to electrically read the presence of the dipolar moiety; the third transmission aperture being in fluid communication with and aligned with first transmission aperture, and is spaced apart from the first shielding electrode and the second shielding electrode; a first dielectric layer interposed between the first shielding electrode and the scrivener electrode and that electrically isolates the first shielding electrode and the scrivener electrode, the first dielectric layer comprising a fourth transmission aperture bounded by the first dielectric layer and that: receives the macromolecule from the first shielding electrode; and communicates the macromolecule through the fourth transmission aperture to the scrivener electrode, and the fourth transmission aperture being in fluid communication with and aligned with first transmission aperture; a second dielectric layer interposed between the scrivener electrode and the second shielding electrode and that electrically isolates the second shielding electrode and the scrivener electrode, the second dielectric layer comprising a fifth transmission aperture bounded by the second dielectric layer and that: receives the macromolecule from the scrivener electrode; and communicates the macromolecule through the fifth transmission aperture to the second shielding electrode, and the fifth transmission aperture being in fluid communication with and aligned with first transmission aperture; and a nanopore that comprises the transmission apertures.

A process for reading data from or writing data to a macromolecule with a molecular scrivener, the process comprising: receiving the macromolecule in the nanopore at the first shielding electrode, the macromolecule comprising a plurality of moieties, wherein the moieties comprise a neutral moiety, a charged moiety, a dipolar moiety, or a combination comprising at least one of the foregoing moieties; electrostatically shielding the scrivener electrode with the first shielding electrode and the second shielding electrode; communicating, in the nanopore, the macromolecule from the first shielding electrode to the scrivener electrode; sequentially receiving, in the nanopore at the scrivener electrode, individual moieties of the macromolecule so that the third potential of the scrivener electrode responds to individual moieties in the macromolecule by: electrically floating, in an absence of a charged moiety or a dipolar moiety of the macromolecule, the scrivener electrode at the third potential such that the third potential is intermediate between the first potential and the second potential; changing, in a presence of the charged moiety of the macromolecule, the third potential from the intermediate potential to electrically read the presence of the charged moiety; and changing, in a presence of the dipolar moiety of the macromolecule, the third potential from the intermediate potential to electrically read the presence of the dipolar moiety; communicating, in the nanopore, the macromolecule from the scrivener electrode to the second shielding electrode; and communicating the macromolecule from the nanopore at the second shielding electrode to expel the macromolecule from the nanopore.

A process for reading data from or writing data to a macromolecule with a molecular scrivener, the process comprising: receiving the macromolecule in the nanopore at the third shielding electrode, the macromolecule comprising a plurality of moieties, wherein the moieties comprise a neutral moiety, a charged moiety, a dipolar moiety, or a combination comprising at least one of the foregoing moieties; electrostatically shielding the first writing electrode and second writing electrode with the third shielding electrode and the first shielding electrode; communicating, in the nanopore, the macromolecule from the third shielding electrode to between the first writing electrode and the second writing electrode; sequentially receiving, in the nanopore between the first writing electrode and the second writing electrode, individual moieties of the macromolecule; communicating the macromolecule from the first writing electrode and the second writing electrode to the scrivener electrode through the nanopore in the first shielding electrode; shielding the scrivener electrode by the first shielding electrode and the second shielding electrode; receiving, in the nanopore at the scrivener electrode, individual moieties of the macromolecule, so that the third potential of the scrivener electrode responds to individual moieties in the macromolecule by: electrically floating, in an absence of the charged moiety or the dipolar moiety of the macromolecule, the scrivener electrode at the third potential such that the third potential V3 is intermediate between the first potential and the second potential; changing, in a presence of the charged moiety of the macromolecule, the third potential from the intermediate potential to electrically read the presence of the charged moiety; and changing, in a presence of the dipolar moiety of the macromolecule, the third potential from the intermediate potential to electrically read the presence of the dipolar moiety; communicating the macromolecule from the nanopore at the scrivener electrode to the nanopore at the second shielding electrode; and communicating the macromolecule from the nanopore at the second shielding electrode to expel the macromolecule from the nanopore.

BRIEF DESCRIPTION OF THE DRAWINGS

The following description should not be considered limiting in any way. With reference to the accompanying drawings, like elements are numbered alike.

FIG. 6 shows in panel A a plan view of the molecular scrivener shown in FIG. 6, in panel B a cross-section along line A-A shown in panel A, and in panel C a cross-section along line B-B shown in panel A;

FIG. 11 shows in panel A a plan view of the molecular scrivener shown in FIG. 9, in panel B a cross-section along line A-A shown in panel A, and in panel C a cross-section along line B-B shown in panel A;

FIG. 30 shows in panel A a graph of scrivener voltage versus moiety and in panel B a graph of scrivener voltage versus base number; and FIG. 31 shows in panel A a graph of potential difference versus moiety and in panel B a graph of scrivener voltage versus moiety.

DETAILED DESCRIPTION

A detailed description of one or more embodiments is presented herein by way of exemplification and not limitation.

It has been discovered that a molecular scrivener herein provides digital storage of digital data on a macromolecule such as a nucleic acid, polymer, and the like. The molecular scrivener encodes in the macromolecule such as a static polymer (e.g., DNA or other collection of nucleobases) or an active polymer, e.g., a redox-switchable polymer. Advantageously and unexpectedly, the molecular scrivener writes data (also referred to as storing information) in a molecular volume or electrostatic dipole of a moiety in a macromolecule and can selectively write data to a bit, i.e., a smallest feature size of the macromolecule. Beneficially, the molecular scrivener writes data to the macromolecule so that, e.g., greater than $10^9$ bits can be stored in the macromolecule. It is contemplated that a storage chip that includes $10^9$ scrivener cells can store greater than $10^{18}$ bits. Additionally, the molecular scrivener reads data from the macromolecule as an electrostatic potential, e.g., of different functional groups, with atomic resolution and writes data to switchable polymers with precision and speed.

In view of an exponential increase of digitally stored data that is approaching limits of conventional storage media, the molecular scrivener provides long-term storage of seldom-used data for archiving data and often-used data for active archiving with low cost, high capacity, and reliable long-term storage in macromolecules. The molecular scrivener overcomes technological problems with writing data statically through synthetic chemistry and also provides practical, dynamic digital storage. Further, to incorporate the molecular scrivener into computing systems, the molecular scrivener can be integrated on a semiconductor chip. Beneficially, the molecular scrivener includes solid-state materials rather than solely biological materials.

Figure 1:
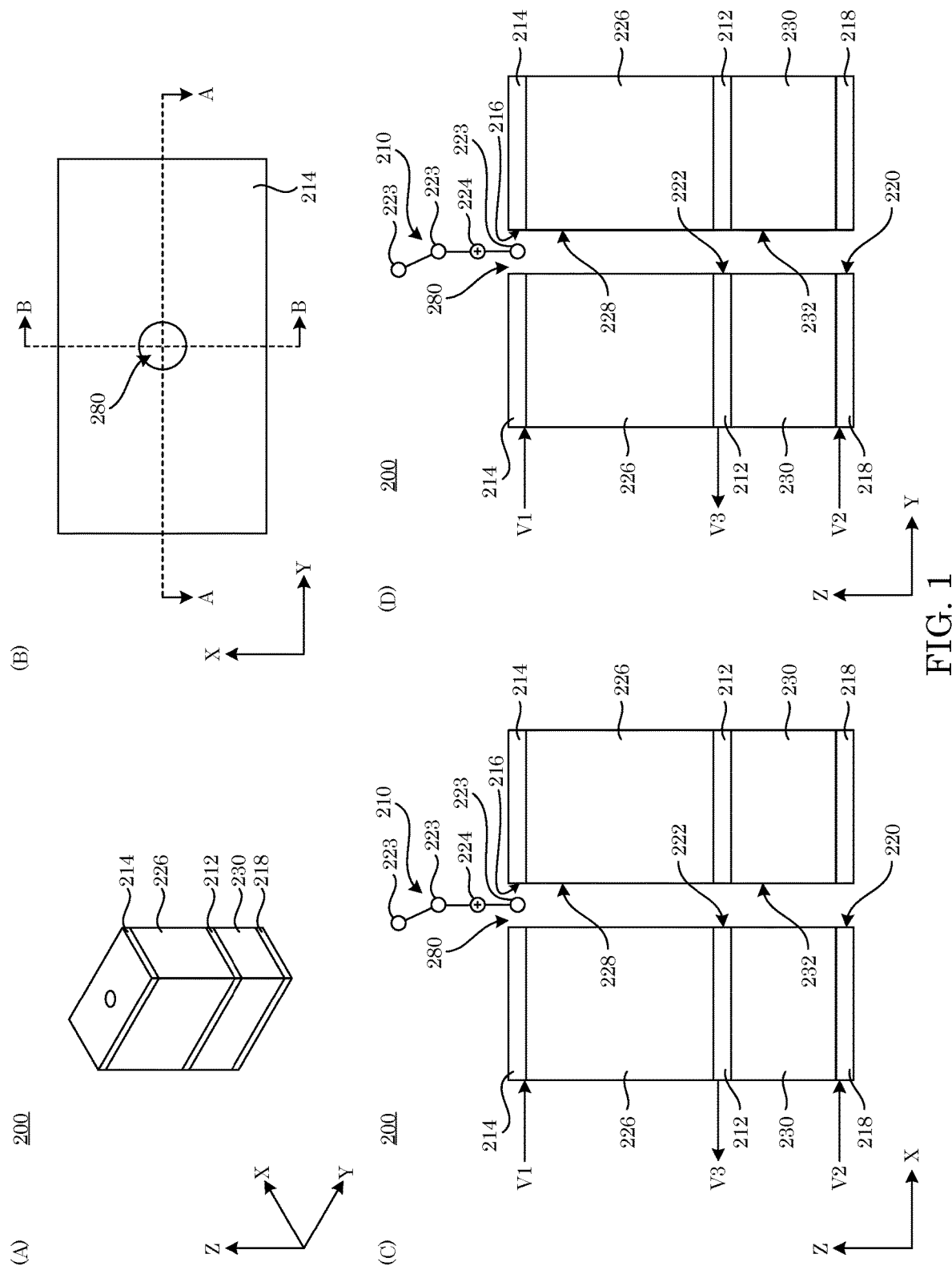
FIG. 1 shows: in panel A a perspective view of a molecular scrivener, in panel B a plan view of the molecular scrivener, in panel C a cross-section along line A-A shown in panel B, and in panel D a cross-section along line A-A shown in panel B.

In an embodiment, with reference to FIG. 1, molecular scrivener 200 writes data to or reads data from macromolecule 210. Molecular scrivener 200 includes a pair of shielding electrodes that includes first shielding electrode 214 and second shielding electrode 218. First shielding electrode 214 includes first transmission aperture 216 bounded by first shielding electrode 214, receives first potential V1, and receives and communicates macromolecule 210 through first transmission aperture 216 in presence of first potential V1. Second shielding electrode 218 includes second transmission aperture 220 bounded by second shielding electrode 218, receives second potential V2, and receives and communicates macromolecule 210 through second transmission aperture 220. Second transmission aperture 220 is in fluid communication with and aligned with first transmission aperture 216. Here, second transmission aperture 220 is spaced apart from first transmission aperture 216. Scrivener electrode 212 is interposed between first shielding electrode 214 and second shielding electrode 218, includes third transmission aperture 222 bounded by scrivener electrode 212, receives macromolecule 210 from first shielding electrode 214, and communicates macromolecule 210 through second transmission aperture 220 to second shielding electrode 218. Moreover, scrivener electrode 212 electrically floats at third potential V3 such that, in an absence of charged moiety 224 or dipolar moiety 225 of macromolecule 210, third potential V3 is intermediate between first potential V1 and second potential V2. Third potential V3 changes in a presence of charged moiety 224 of the macromolecule 210 to electrically read the presence of the charged moiety 224, and third potential V3 changes in a presence of dipolar moiety 225 of macromolecule 210 to electrically read the presence of dipolar moiety 225. Additionally, third transmission aperture 222 is in fluid communication with and aligned with first transmission aperture 216 and is spaced apart from first shielding electrode 214 and second shielding electrode 218. In molecular scrivener 200, first dielectric layer 226 is interposed between first shielding electrode 214 and scrivener electrode 212 to electrically isolate first shielding electrode 214 and scrivener electrode 212, First dielectric layer 226 includes fourth transmission aperture 228 that is bounded by first dielectric layer 226, receives macromolecule 210 from first shielding electrode 214, and communicates macromolecule 210 through fourth transmission aperture 228 to scrivener electrode 212. Fourth transmission aperture 228 is in fluid communication with and aligned with first transmission aperture 216. Similarly, second dielectric layer 230 is interposed between scrivener electrode 212 and second shielding electrode 218 to electrically isolate second shielding electrode 218 and scrivener electrode 212, wherein second dielectric layer 230 includes fifth transmission aperture 232 bounded by second dielectric layer 230 and that receives macromolecule 210 from scrivener electrode 212 and communicates macromolecule 210 through fifth transmission aperture 232 to second shielding electrode 218. Fifth transmission aperture 232 is in fluid communication with and aligned with first transmission aperture 216. Molecular scrivener 200 also includes nanopore 280 that includes transmission apertures (216, 218, 222, 232, 220). In this configuration, molecular scrivener 200 receives macromolecule 210 in nanopore 280 at first shielding electrode 214, communicates macromolecule 210 through nanopore 280 such that individual moieties (e.g., 223, 224, 225) or incident at scrivener electrode 212. Scrivener electrode 212 detect the presence of charged moiety 224 and dipolar moiety 225 by changing third potential V3 in presence of charged moiety 224 or dipolar moiety 225 of macromolecule 210.

Figure 2:
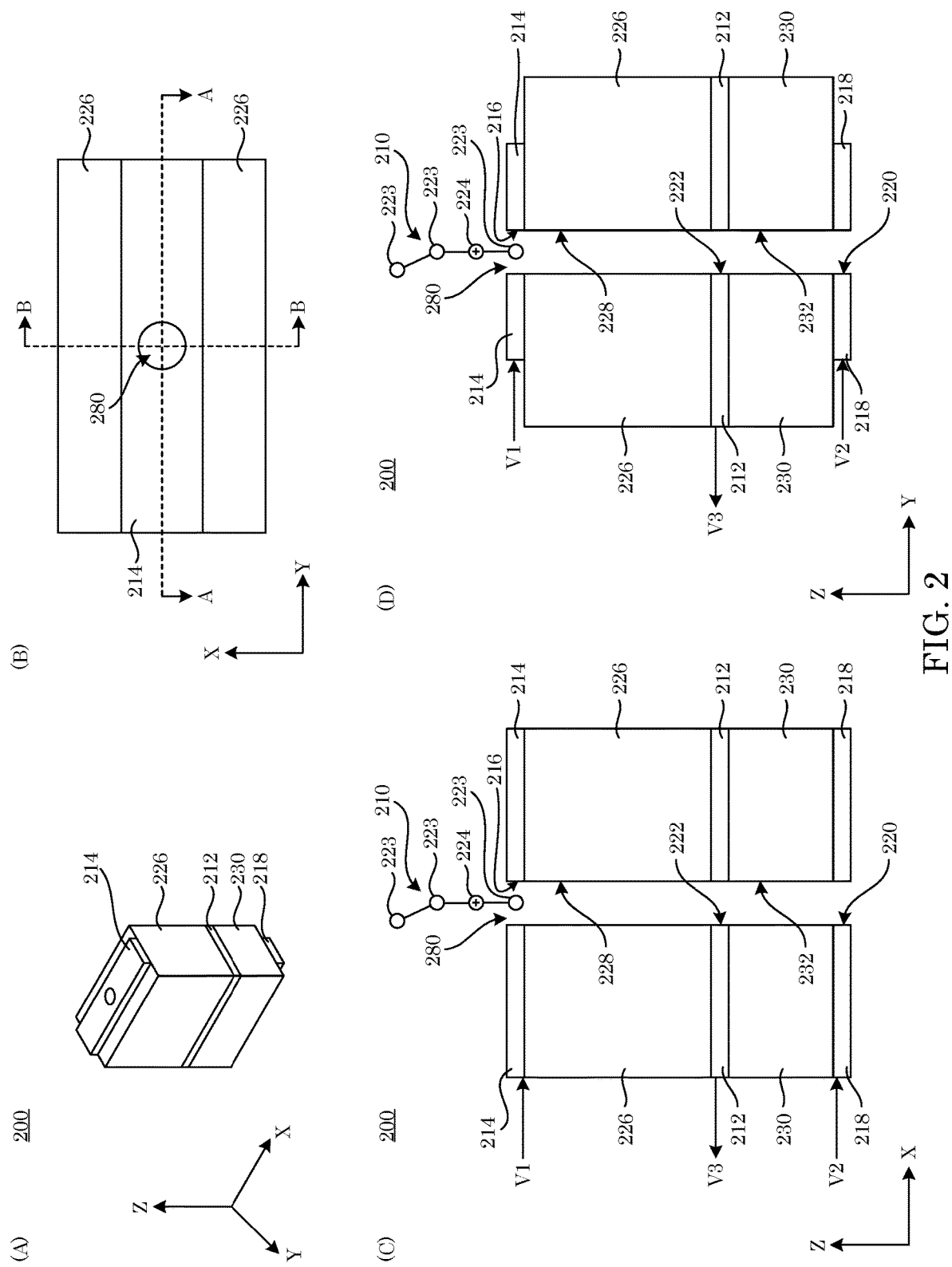
FIG. 2 shows: in panel A a perspective view of a molecular scrivener, in panel B a plan view of the molecular scrivener, in panel C a cross-section along line A-A shown in panel B, and in panel D a cross-section along line A-A shown in panel B.

Electrodes (e.g., 212, 214, 218) can be various sizes and shapes such as completely covering dielectric layer 226 with first shielding electrode 214 as shown in FIG. 1 or partially covering dielectric layer 226 with first shielding electrode 214 as shown in FIG. 2.

Figure 3:
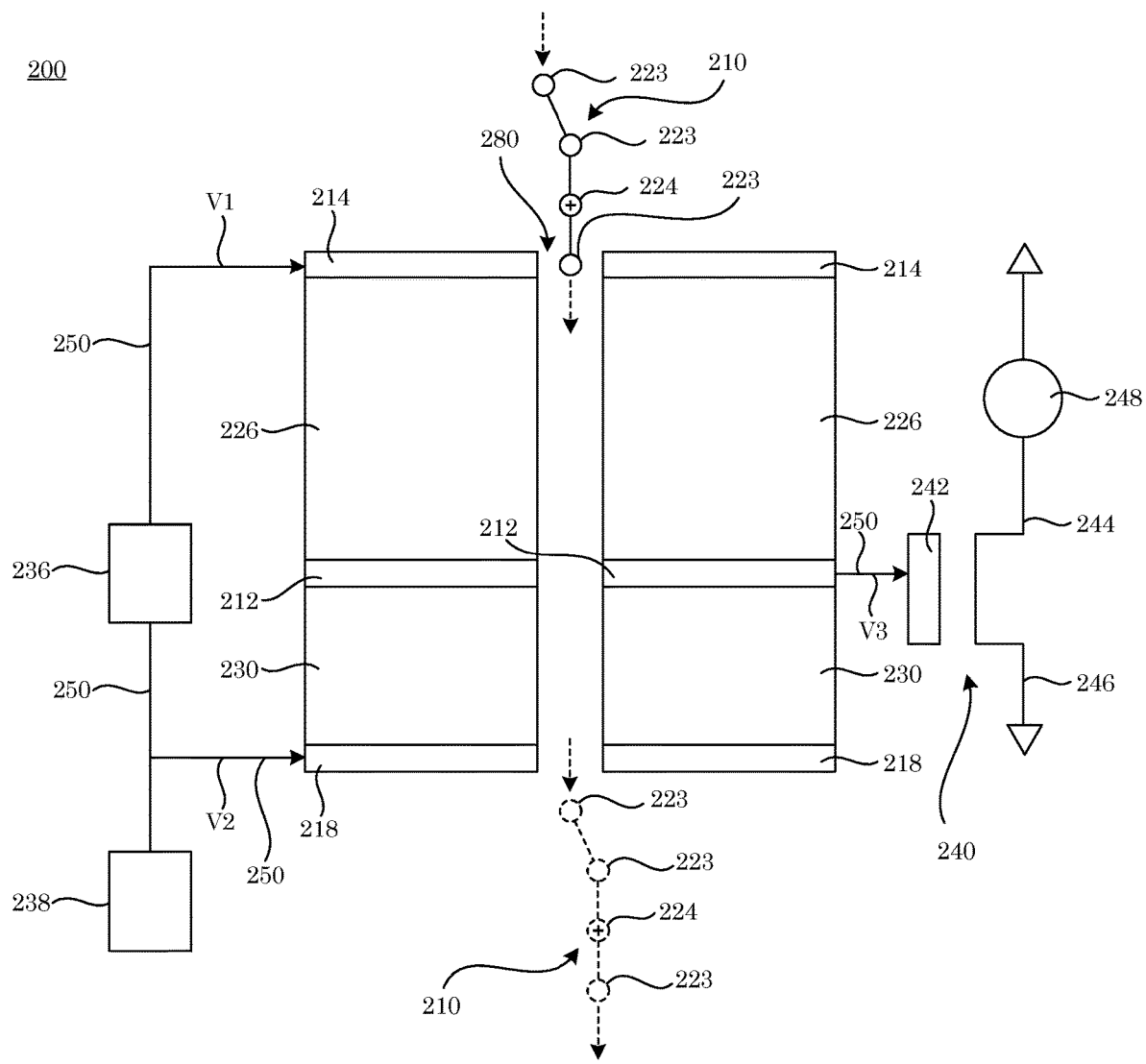
FIG. 3 shows a molecular scrivener for reading data in a macromolecule.

In an embodiment, with reference to FIG. 3, molecular scrivener 200 includes first power source 236 in electrical communication with first shielding electrode 214 and that provides first potential V1 to first shielding electrode 214 such that first shielding electrode 214 electrostatically shields scrivener electrode 212 from electrostatic interaction with an electric field exterior to nanopore 280. Second power source 238 is in electrical communication with first power source 236 and second shielding electrode 218 and provides second potential V2 to second shielding electrode 218 such that second shielding electrode 218 electrostatically shields scrivener electrode 212 from electrostatic interaction with electric fields exterior to nanopore 280. Here, first power source 236 receives second potential V2 from second power source 238 and provides first potential V1 referenced to second potential V2. Electrical connections can be made by electrical conductor 250 that can be, e.g., a wire.

Detector 240 is in electrical communication with scrivener electrode 212 and receives third potential V3 from scrivener electrode 212 and produces an electrical signal. It is contemplated that a change in electrical current in the electrical signal is proportional to the change in third potential V3 from scrivener electrode 212. According to an embodiment, detector 240 includes a field effect transistor that includes gate electrode 242 in electrical communication with scrivener electrode 212 and that receives third potential V3 from scrivener electrode 212. The effect transistor 240 also includes drain electrode 244 and source electrode 246 that communicate the electrical current such that an amount of change in the electrical current is proportional to the change in third potential received at gate electrode 242 from scrivener electrode 212. Electrical current can be measured by current amplifier 248.

Figure 4:
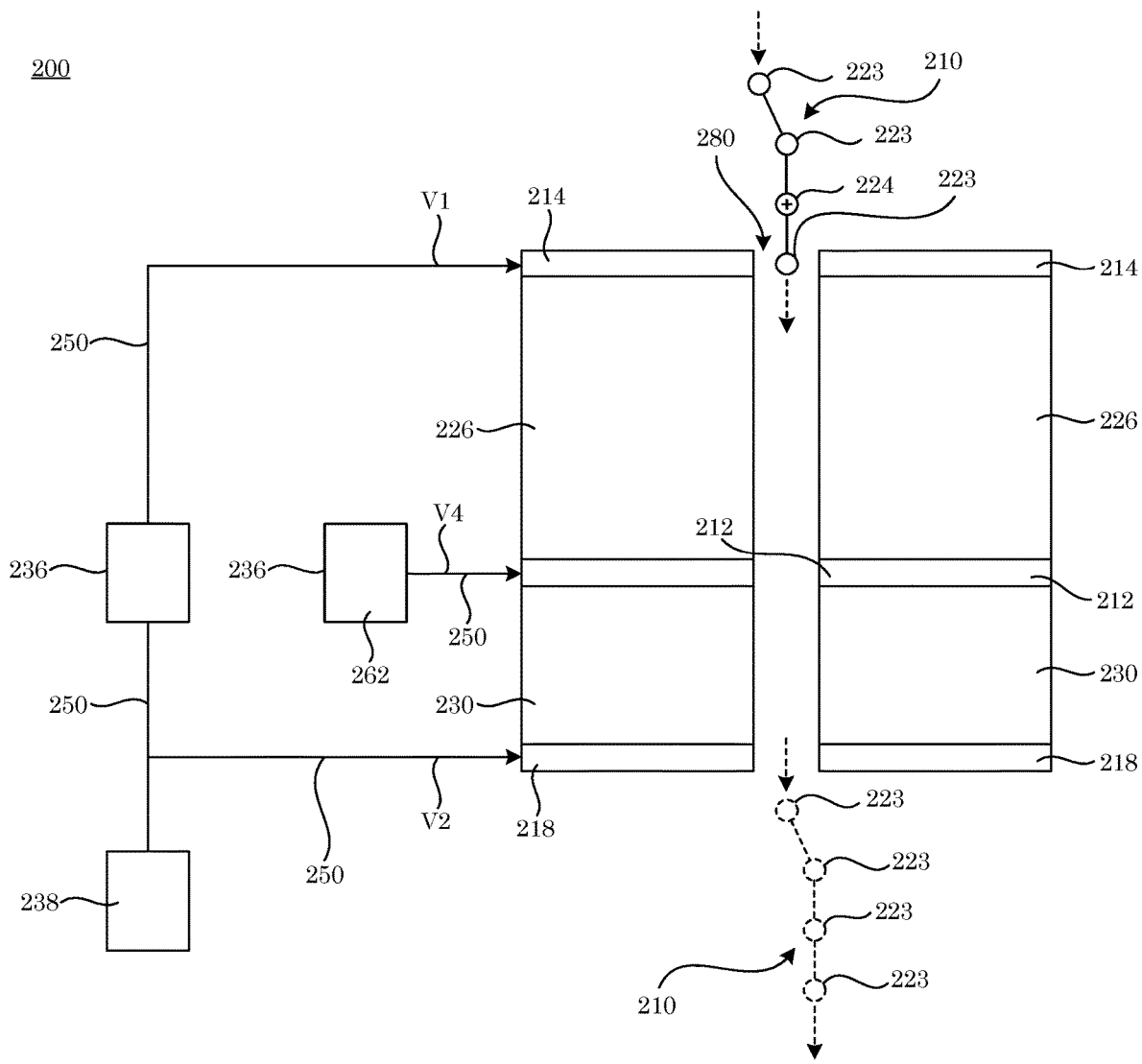
FIG. 4 shows a molecular scrivener for writing data to a macromolecule.

In an embodiment, with reference to FIG. 4, molecular scrivener 200 includes power source 262 in electrical communication with scrivener electrode 212. Power source 262 provides fourth potential V4 to scrivener electrode 212. When moiety (223, 224, or 225) of macromolecule 210 is received in aperture 222 of scrivener electrode 212, moiety (223, 224, or 225) is subjected to electric field and electron transfer occurs between moiety (223, 224, or 225) and scrivener electrode 212 to write a bit to moiety (223, 224, or 225). That is, when neutral moiety 223 is present at scrivener electrode 212, neutral moiety 223 is reduced and obtains a negative charge to become a negatively charged moiety. When positively charged moiety 224 is present at scrivener electrode 212, positively charged moiety 224 receives an electron from scrivener electrode 212 and converts into neutral moiety 223. When dipolar moiety 225 is present at scrivener electrode 212, dipolar moiety 225 receives electron from scrivener electrode 212 and becomes a negatively charged moiety. In this manner, molecular scrivener 200 writes data to macromolecule 210 at a bit-level through charge exchange with macromolecule 210.

Figure 5:
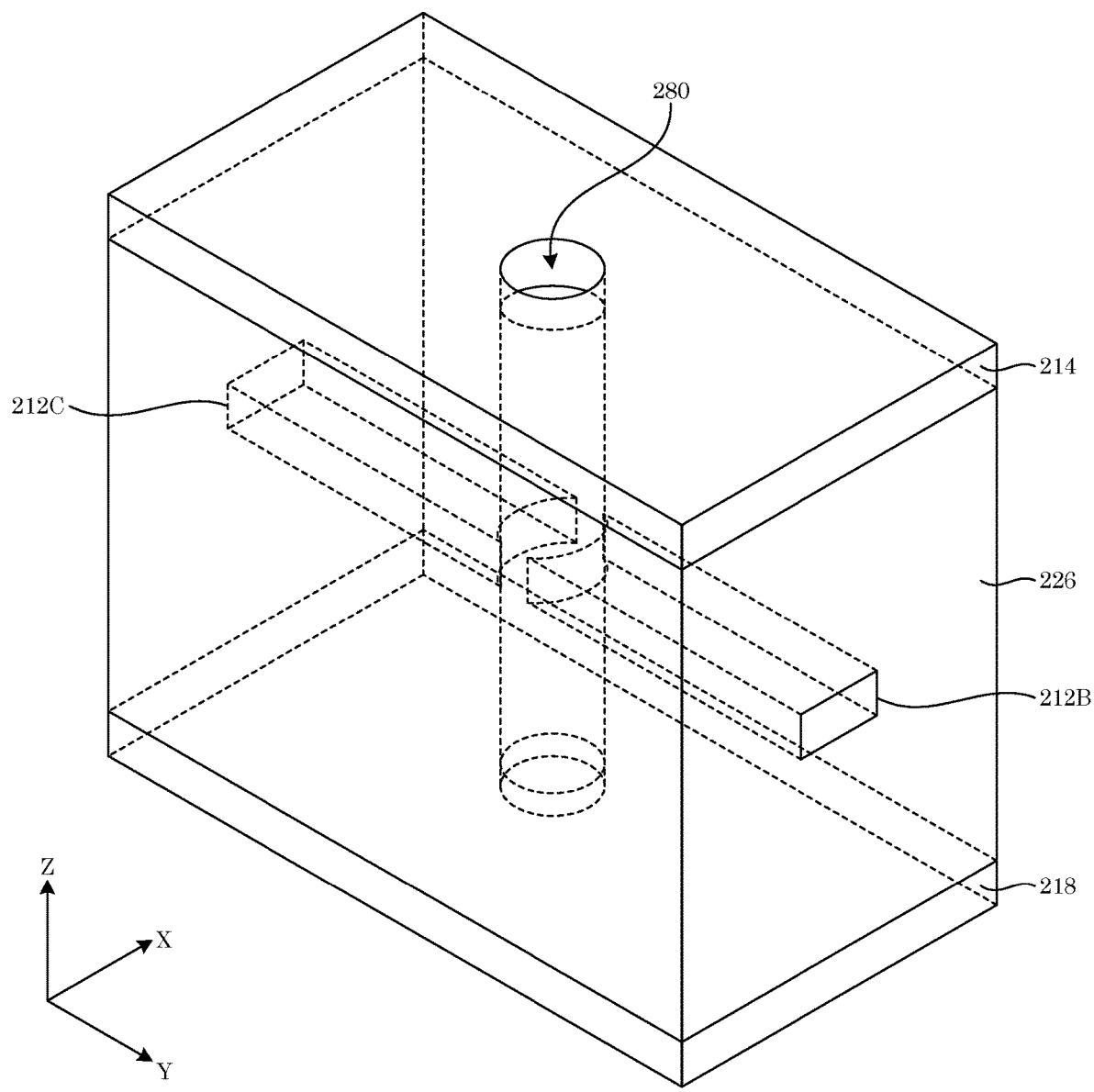
FIG. 5 shows a perspective view of a molecular scrivener.

According to an embodiment, with reference to FIG. 5 and FIG. 6, molecular scrivener 200 includes first writing electrode 212B and second writing electrode 212C interposed between first shielding electrode 214 and second shielding electrode 218. Dielectric layer 226 is interposed between first shielding electrode 214 of second shielding electrode 218 as well as first writing electrode 212 B and second writing electrode 212 feet to electrically isolate electrodes (214, 218, 212B, 212C) from one another. First writing electrode 212B receives fourth potential V4, and second writing electrode 212C receives fifth potential V5. First writing electrode 212B and second writing electrode 212 C bound nanopore 280, are opposingly disposed on opposite sides of nanopore 280, and change a charge of a moiety (e.g., 223, 224, 225) in nanopore 280 between first writing electrode 212B and second writing electrode 212C when fourth potential V4 is different from fifth potential V5.

Figure 7:
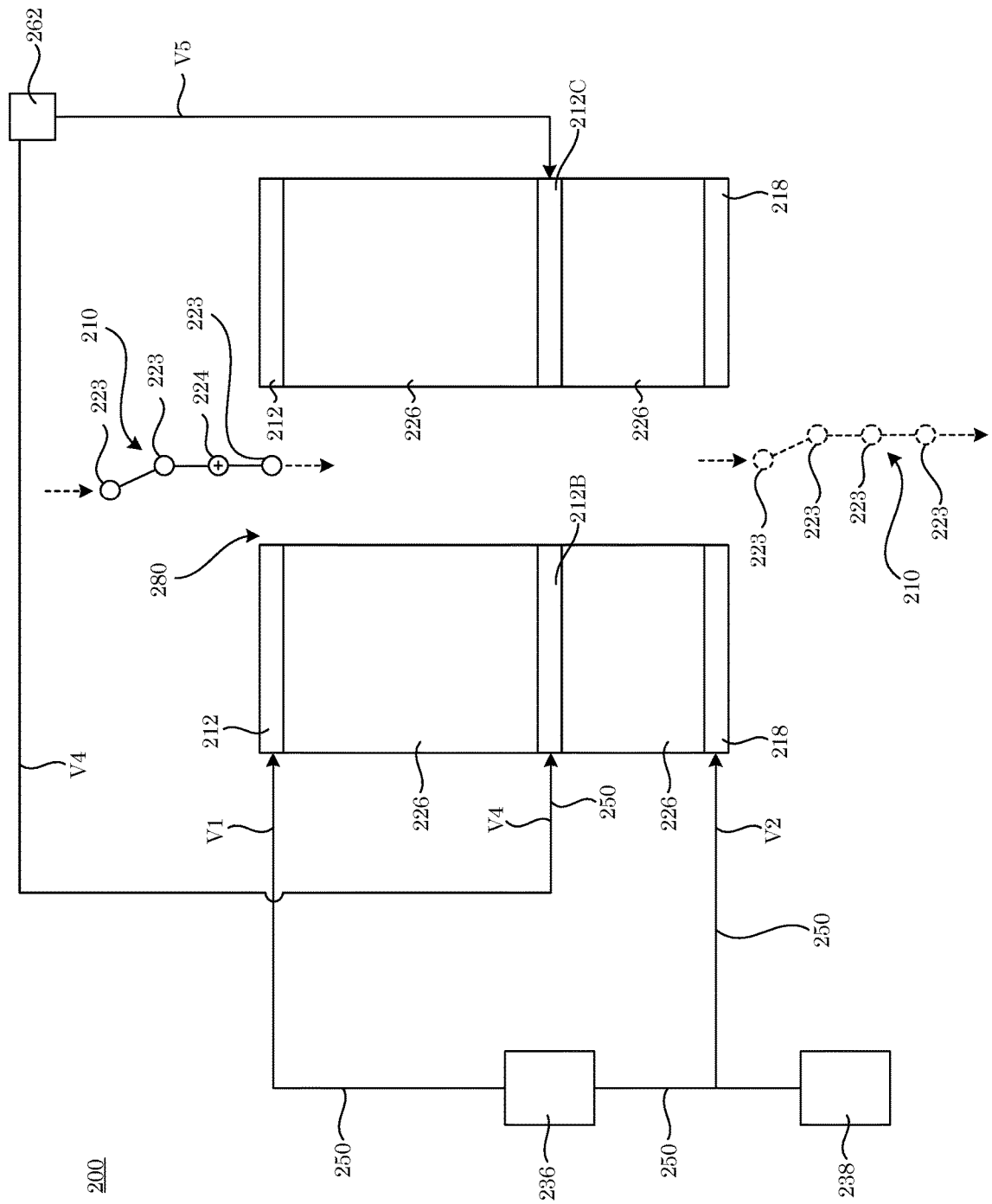
FIG. 7 shows a molecular scrivener shown in FIG. 6 for writing data to a macromolecule.

According to an embodiment with reference to FIG. 7, power source 262 is electrically interposed between first writing electrode 212B and second writing electrode 212C respectively to provide fourth potential V4 and fifth potential V5.

Figure 8:
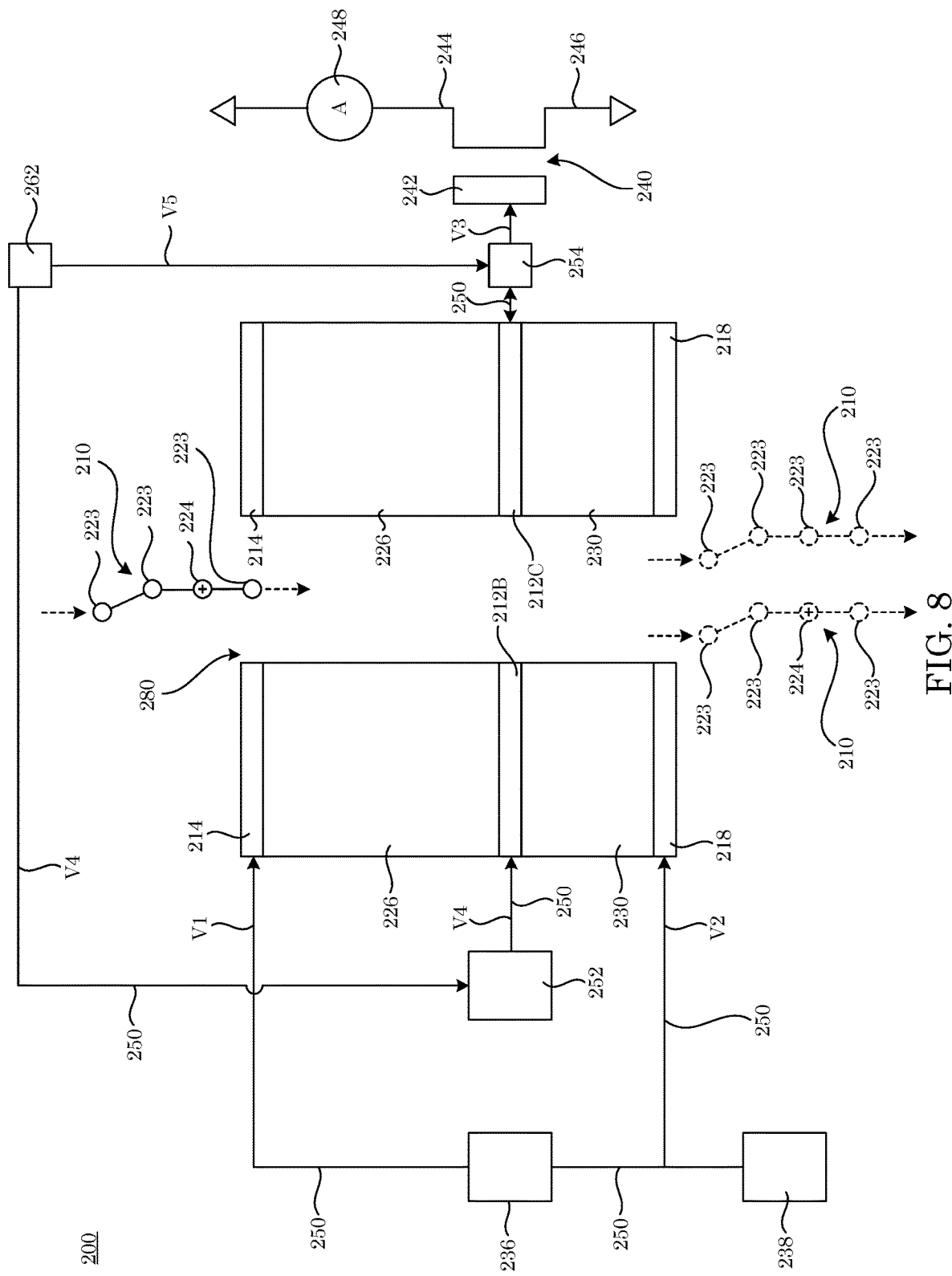
FIG. 8 shows a molecular scrivener for reading data in a macromolecule and for writing data to macromolecule.

In an embodiment, with reference to FIG. 8, molecular scrivener 200 includes switch 252 electrically interposed between power source 262 and first writing electrode 212B. Switch 254 is electrically interposed between second writing electrode 212 C and each of power source 262 and detector 240, e.g., gate electrode 242. To write a bit to macromolecule 210, switch 252 is closed to communicate fourth voltage V4 from power source 262 to first writing electrode 212B, and switch 254 is closed between power source 262 and second writing electrode 212C to communicate fifth voltage V5 from power source 262 to second writing electrode 212 C while switch 254 is open between second writing electrode 212 C and gate electrode 242 of detector 240 to isolate detector 240 from second writing electrode 212 C and power source 262. In this configuration, power source 262 provides voltages to cause electron transfer from writing electrodes (212B, 212C) to macromolecule 210 to write the bit thereto. To read bits stored in macromolecule 210, switch 252 is open to isolate power source 262 from first writing electrode 212B, and switch 254 is open to isolate power source 262 from second writing electrode 212C while switch 254 is closed between second writing electrode 212 C and gate electrode 242 of detector 240 to communicate third potential V3 from second writing electrode 212 C to gate electrode 242 of detector 240. In this configuration, power source 262 is isolated from writing electrodes (212 B, 212 C) and detector 240 so that writing electrodes (212B, 212C) reads bits stored in macromolecule 210.

Figure 9:
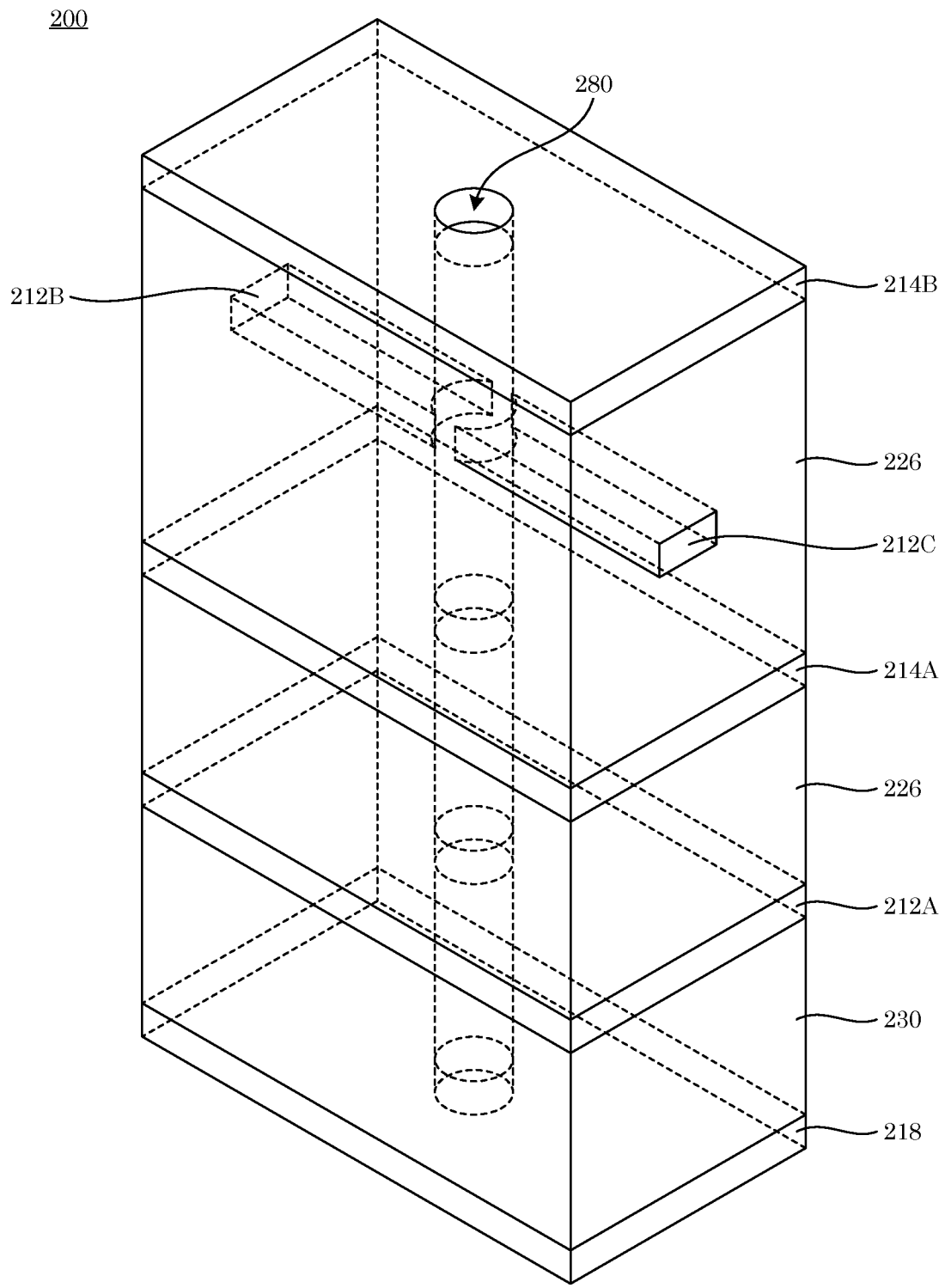
FIG. 9 shows a molecular scrivener for writing data to a macromolecule and reading data in a macromolecule.
Figure 10:
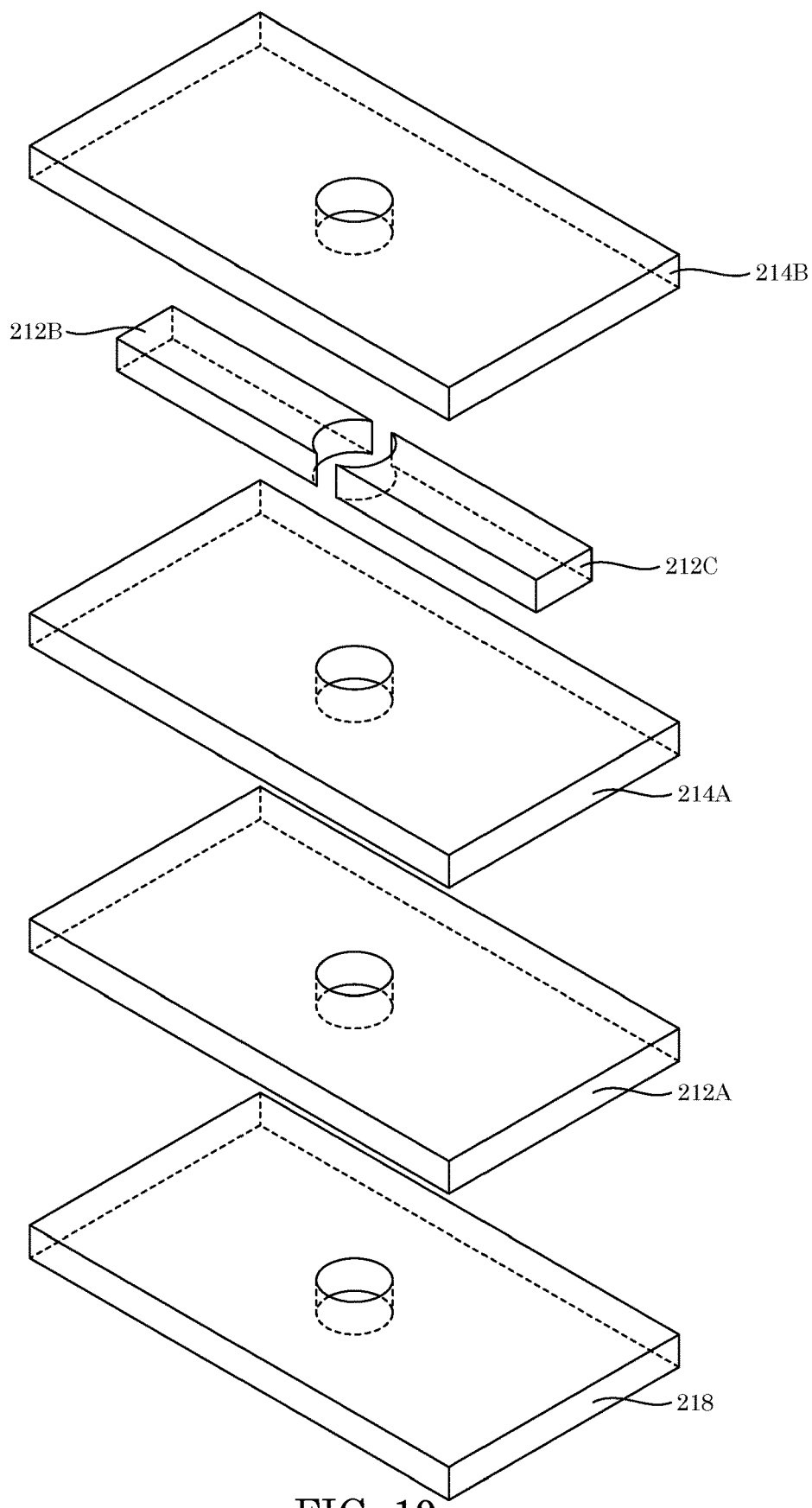
FIG. 10 shows an exploded view of electrodes included in the molecular scrivener shown in FIG. 9 (dielectric material not shown)

In an embodiment, with reference to FIG. 9, FIG. 10, and FIG. 11, molecular scrivener 200 includes third shielding electrode 214B disposed on first writing electrode 212B and second writing electrode 212C, which are disposed on first shielding electrode 214A. Third shielding electrode 214B includes an electrode aperture that bounds nanopore 280, receives macromolecule 210, and communicates macromolecule 210 to first shielding electrode 214A after passing between first writing electrode 212B and second writing electrode 212C, wherein first writing electrode 212B and second writing electrode 212C are interposed between third shielding electrode 214B and first shielding electrode 214A. Third dielectric layer 226 includes an aperture that bounds 280 nanopore and is interposed between first shielding electrode 214A and third shielding electrode 214B, first shielding electrode 214 and each of first writing electrode 212B and second writing electrode 212C, and third shielding electrode 214B and each of first writing electrode 212B and second writing electrode 212C. Third dielectric layer 226 electrically insulates from one another first shielding electrode 214A, third shielding electrode 214B, first writing electrode 212B, and second writing electrode 212C.

Figure 12:
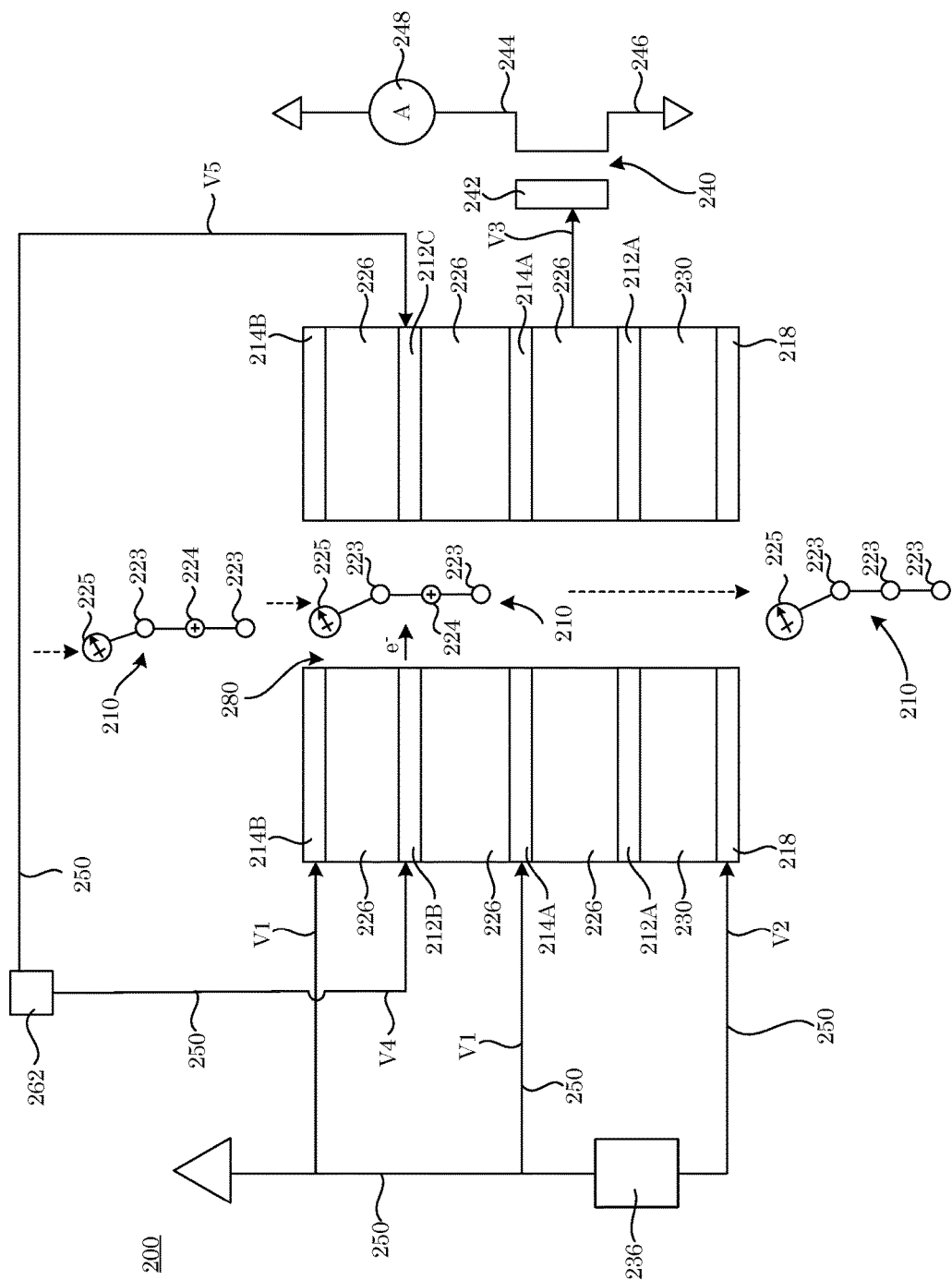
FIG. 12 shows a molecular scrivener for writing data to a macromolecule and reading data in a macromolecule.

According to an embodiment, with reference to FIG. 12, molecular scrivener 200 includes write power source 262 in electrical communication with first writing electrode 212B and second writing electrode 212C. Power source 262 provides fourth potential V4 to first writing electrode 212B and fifth potential V5 to second writing electrode 212C. Third shielding electrode 214B and first shielding electrode 214A can be in electrical communication to electrically shield first writing electrode 212B and second writing electrode 212C from external electric fields. Power source 236 can be referenced to first voltage V1 and provide second voltage V2 to second shielding electrode 218, wherein first voltage V1 can be the same or different than second voltage V2. As a result, macromolecule 210 is subjected to selectively receiving bits from first writing electrode 212B and second writing electrode 212C in which bits are written to moieties (e.g., 223, 224, 225) of macromolecule 210 by writing electrodes (212B, 212C). Further, scrivener electrode 212A reads bits stored in moieties (e.g., 224, 225) of macromolecule 210A.

Figure 13:
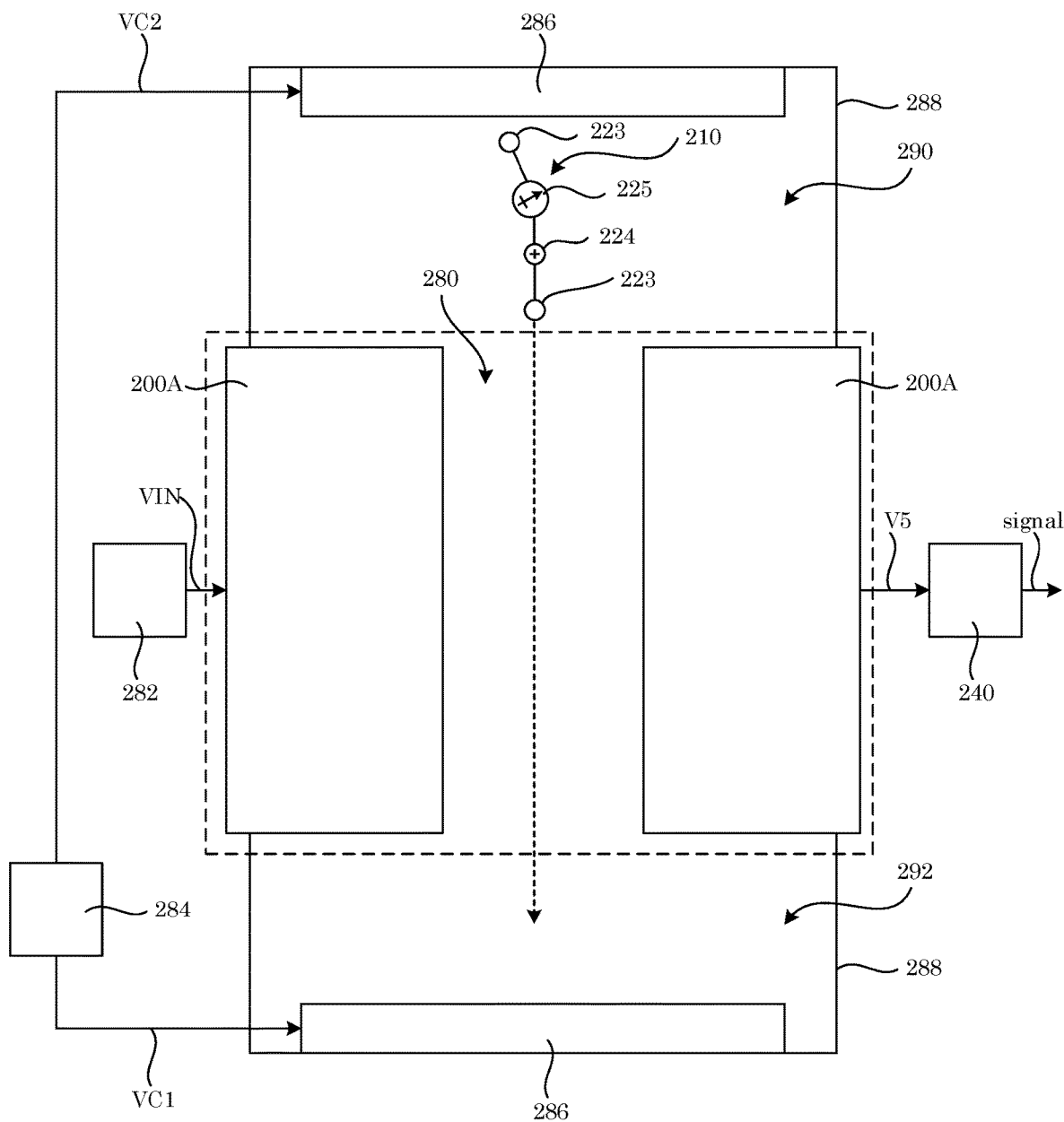
FIG. 13 shows a molecular scrivener for writing data to a macromolecule.
Figure 14:
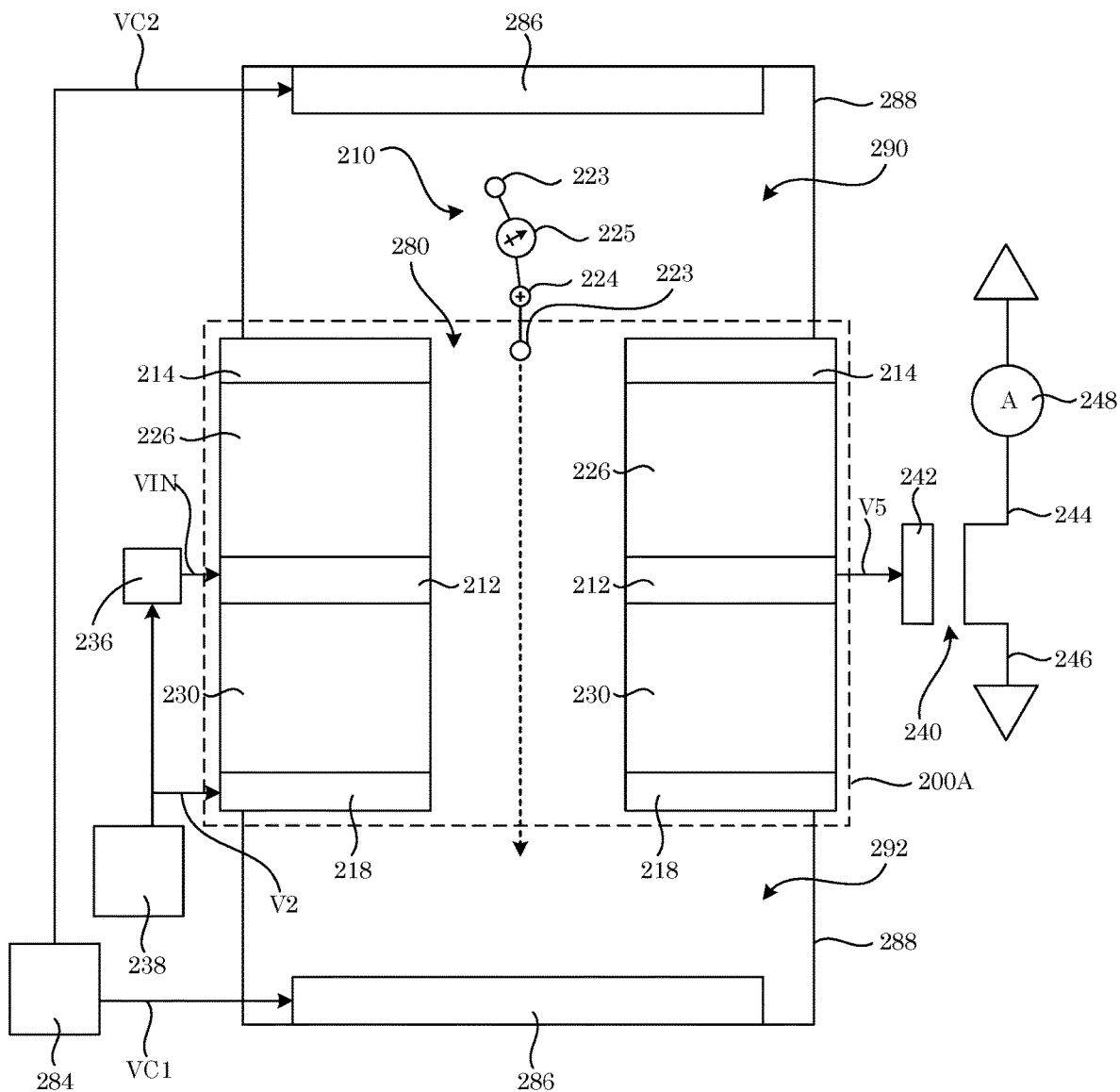
FIG. 14 shows a molecular scrivener for writing data to a macromolecule.

In an embodiment, with reference to FIG. 13 and FIG. 14, molecular scrivener 200 includes scrivener structure 200A interposed between first compartment 290 and second compartment 292 of container 288 in which first compartment 290 and second compartment 292 are in fluid communication via nanopore 280. In container 288, first compartment 290 bounds a supply volume that is in fluid communication with nanopore 280 and third shielding electrode 214 and provides macromolecule 210 disposed in first compartment 290 to nanopore 280. Second compartment 292 bounds a receiver volume and is in fluid communication with nanopore 280 and second shielding electrode 218 and receives macromolecule 210 from nanopore 280. First control electrode 286 is disposed in first compartment 290 and imparts a transmissive force on macromolecule 210 disposed in first compartment 288 to communicate macromolecule 210 from first compartment 290 to nanopore 280. Second control electrode 286 is disposed in second compartment 292 and imparts the transmissive force in nanopore 280 to communicate macromolecule 210 from nanopore 280 to second compartment 292. Control electrodes 286 are in electrical communication with power source 284 that provides a bias potential to control electrodes 286 by which the transmissive force is produced and subjected to macromolecule 210. Power source 282 can include, e.g., power sources (236, 238) to provide input voltage VIN (e.g., first potential V1, second voltage V2) to various electrodes, and detector 240 receives scrivener voltage VS (e.g., third voltage V3) and produces the electrical signal, e.g., an electric current, based on scrivener voltage VS. It should be appreciated that FIG. 13 is generic to the molecular scriveners disclosed herein in that scrivener structure 200A can be any of the molecular scriveners described above or shown in FIG. 1 to FIG. 12, wherein FIG. 14 shows that scrivener structure 200A of FIG. 13 is embodied as molecular scrivener 200 shown in FIG. 3.

Molecular scrivener 200 electrostatically reads data (also referred to as a bit) stored in macromolecule 210 or electrochemically writes data to macromolecule 210. Macromolecule 210 can include neutral moiety 223, charged moiety 224, dipolar moiety 225, or a combination thereof. Exemplary macromolecules 210 include a protein, nucleic acid, polymer, and the like. Exemplary proteins include serum albumin, S100B (calcium binding protein), NSE (neuronal glycolytic enzyme), TNF-α (tissue necrosis factor), troponin, creatinine kinase, or myoglobin. Exemplary nucleic acids include single and double-stranded DNA and RNA oligonucleotides, messenger RNA, micro RNA, or siRNA. Exemplary polymers include poly(ethylene glycol), poly (vinyl pyrrolidone), or poly(styrene sulfonate). Neutral moieties 223 can include an atom, a nucleobase, or a monomer. Charged moieties 224 can be negatively charged or positively charged. Charged moieties 224 can be a charged form of neutral moiety 223 such as a cation of neutral moiety 223 or an anion of neutral moiety 223. Exemplary charged moieties 224 include phosphate, or sulfonate. Dipolar moiety 225 includes an electric dipole moment produced by the electronic structure of atoms in dipolar moiety 225. Exemplary dipolar moieties 225 include hydrogen cyanide, or cyanamide. A molecular weight of macromolecule 210 can be from $10^2$ g/mole to $10^8$ g/mole. In an embodiment, macromolecule 210 is a polymer comprised of nucleic acids, protein amino acid side chains, synthetic monomers, or a combination of these.

In molecular scrivener 200, scrivener electrode 212 electrostatically reads data stored as bits in macromolecule 210. Scrivener electrode 212 can include an atomically-thin electrically conductive membrane or a metal as a floating gate for detector 240. Exemplary atomically-thin electrically conductive membranes for scrivener electrode 212 include graphene, carbon nanorod, and other 2-dimensional electrical conductors. Exemplary metals include platinum, gold, and the like. A thickness of scrivener electrode 212 can be from 0.1 nm to 10 nm, specifically from 0.1 nm to 5 nm, and more specifically from 0.15 nm to 2 nm. A length and width of scrivener electrode 212 independently can be from 0.5 nm to 1000 nm, specifically from 5 nm to 200 nm, and more specifically from 10 nm to 50 nm. An electrical resistance of scrivener electrode 212 can be from 0.1Ω to 10MΩ, specifically from 1Ω to 1MΩ, and more specifically from 10Ω to 100 kΩ. In an embodiment, scrivener electrode 212 includes graphene, platinum, or transition metal dichalchagenides. Aperture 222 in scrivener electrode 212 communicates macromolecule 210 in nanopore 280 and can have a size (i.e., a largest linear dimension orthogonal to a length of nanopore 280) from 0.3 nm to 100 nm, specifically from 1 nm to 20 nm, and more specifically from 1.5 nm to 5 nm.

Writing electrodes (e.g., 212B, 212C) electrochemically write data as bits in macromolecule 210 through electron transfer of electrons from writing electrodes (212B, 212C) to a moiety in macromolecule 210. Writing electrodes can include an atomically-thin electrically conductive membrane or a metal. Exemplary atomically-thin electrically conductive membrane for writing electrodes include graphene, carbon nanorod, and other 2-dimensional electrical conductors. Exemplary metals include platinum, gold, and the like. A thickness of writing electrodes can be from 0.1 nm to 10 nm, specifically from 0.1 nm to 5 nm, and more specifically from 0.15 nm to 2 nm. A length and width of writing electrodes independently can be from 0.5 nm to 1000 nm, specifically from 5 nm to 200 nm, and more specifically from 10 nm to 50 nm. An electrical resistance of writing electrodes can be from 0.1Ω to 10MΩ, specifically from 1Ω to 1MΩ, and more specifically from 10Ω to 100 kΩ. An aperture bounded by writing electrodes that communicates macromolecule 210 in nanopore 280 can have a size (i.e., a largest linear dimension orthogonal to a length of nanopore 280) from 0.3 nm to 100 nm, specifically from 1 nm to 20 nm, and more specifically from 1.5 nm to 5 nm.

Figure 15:
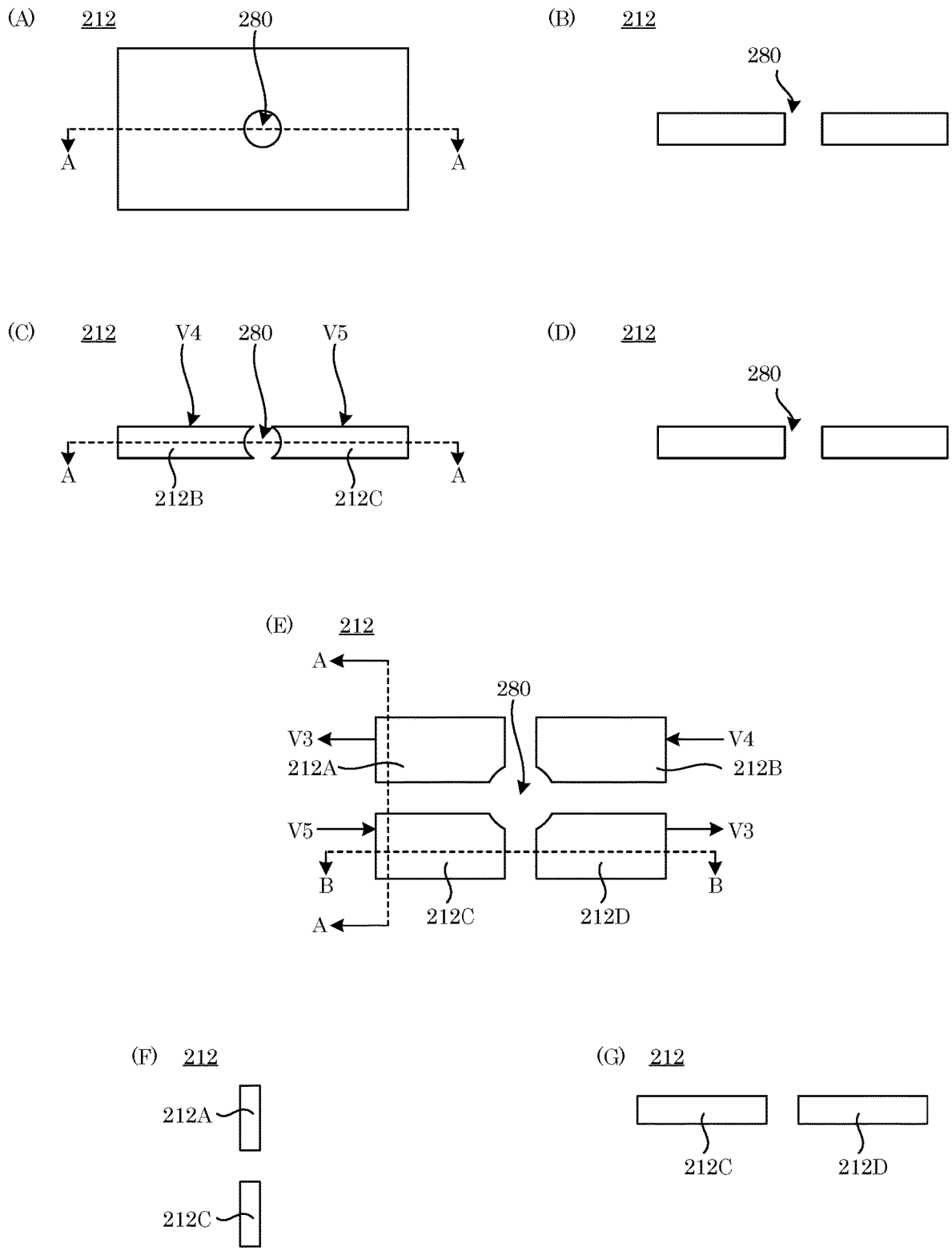
FIG. 15 shows in panel A a plan view of a scrivener electrode that includes a transmission aperture, in panel B a cross-section along line A-A shown in panel A, in panel C a plan view of scrivener electrodes disposed on opposing sides of a transmission aperture, in panel D a cross-section along line A-A shown in panel C, in panel E a plan view of scrivener electrodes disposed on opposing sides of a transmission aperture, in panel F a cross-section along line A-A shown in panel E, and in panel G a cross-section along line B-B shown in panel E.

FIG. 15 shows exemplary formats of scrivener electrodes and writing electrodes. In an embodiment, scrivener electrode is a single element with an aperture as shown in the plan view of panel A with a cross-section as shown in panel B. Scrivener or writing electrodes can include a plurality of electrodes as shown in panels C and E. According to an embodiment, with reference to panel C, electrode 212B and electrode 212C can be disposed opposing one another and bound an aperture so that the same potential (e.g. third potential) or different potentials (e.g., fourth potential V4, fifth potential V5) can be applied thereto. According to an embodiment, with reference to panel E, electrodes (212A, 212B, 212C, 212D) can be disposed opposing one another to bound an aperture so that the same potential (e.g. third potential) or different potentials (e.g., third potential V3, fourth potential V4, fifth potential V5) can be applied thereto to separately read and write data in macromolecule 210.

Shielding electrodes (214, 218) shield scrivener electrode 212 and writing electrodes (212B, 212C) from electric fields exterior to shielding electrodes, e.g., from electrode 286. Shielding electrodes (214, 218) can include a metal or conductive oxide to be a ground-plane or shield scrivener electrode 212 or writing electrodes. Exemplary metals for shielding electrodes include gold, copper, platinum, and the like. Exemplary conductive oxides include indium tin oxide and the like. A thickness of shielding electrodes (214, 218) independently can be from 0.1 nm to 10 nm, specifically from 0.1 nm to 5 nm, and more specifically from 0.15 nm to 2 nm. A length and width of shielding electrodes (214, 218) independently can be from 1 nm to $10^5$ nm, specifically from 10 nm to $10^3$ nm, and more specifically from 50 nm to 300 nm. An electrical resistance of shielding electrodes (214, 218) independently can be from 0.1Ω to 100 kΩ, specifically from 1Ω to 10 kΩ, and more specifically from 10Ω to 1 kΩ. Apertures in shielding electrodes (214, 218) communicate macromolecule 210 in nanopore 280 and independently can have a size (i.e., a largest linear dimension orthogonal to a length of nanopore 280) from 0.3 nm to 100 nm, specifically from 1 nm to 20 nm, and more specifically from 1.5 nm to 5 nm.

Dielectric layers (226, 230, and the like) electrically isolate electrodes from another and bound nanopore 280. Exemplary materials for dielectric layers include silicon oxide, silicon nitride, hafnium oxide, and the like. A thickness of dielectric layers independently can be from 1 nm to $10^3$ nm, specifically from 1.5 nm to 100 nm, and more specifically from 2 nm to 10 nm. A length and width of dielectric layers independently can be from 5 nm to $5 \times 10^8$ nm, specifically from 20 nm to $3 \times 10^8$ nm, and more specifically from 100 nm to $1 \times 10^8$ nm. An electrical resistance of dielectric layers at the voltage difference between scrivener electrode 212 and shielding electrodes 214 and 218 independently can be from $10^{17} \Omega$ to $10^{50} \Omega$, specifically from $10^{17} \Omega$ to $10^{30} \Omega$, and more specifically from $10^{17} \Omega$ to $10^{24} \Omega$. In an embodiment, dielectric layers include $SiO_2$, $HfO_2$, hexagonal boronitride, and the like. Apertures in dielectric layers communicate macromolecule 210 in nanopore 280 and independently can have a size (i.e., a largest linear dimension orthogonal to a length of nanopore 280) from 0.3 nm to 100 nm, specifically from 1 nm to 20 nm, and more specifically from 1.5 nm to 5 nm.

Figure 16:
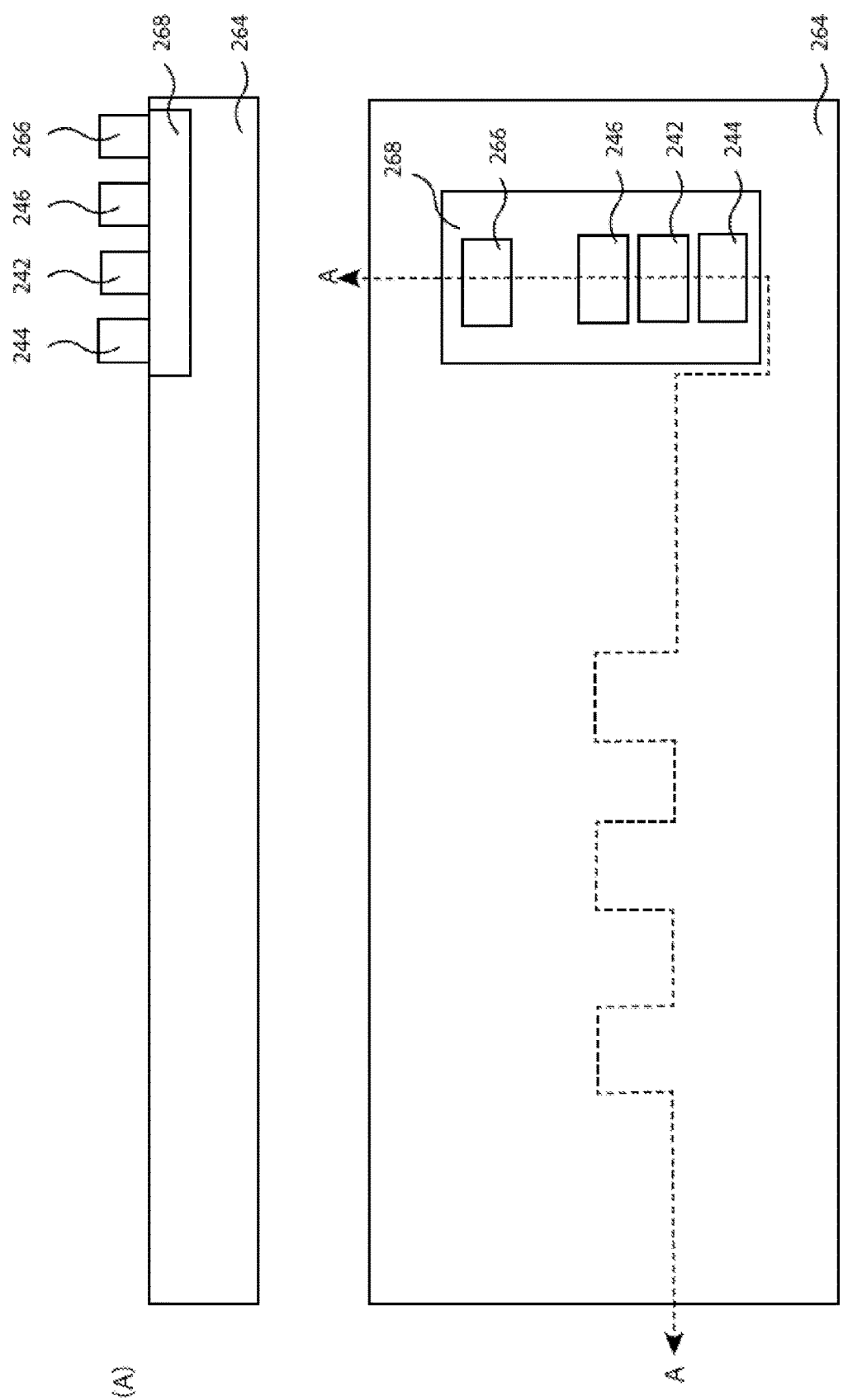
FIG. 16 shows a plan view of a substrate and detector involved in making a molecular scrivener in panel A, and panel B shows a cross-section along line A-A shown in panel A.

Detector 240 receives third voltage V3 from scrivener electrode 212 to detect data stored as bits in macromolecule 210. Exemplary detectors 240 include a high-speed CMOS transistor, FET, or similar high-gain amplifier. A sensitivity of detector 240 can be from 0.001 pA/charge to $10^7$ pA/charge, specifically from 0.1 pA/charge to $10^7$ pA/charge, and more specifically from 10 pA/charge to $10^5$ pA/charge. In an embodiment, detector 240 is field-effect transistor (FET), specifically a metal-oxide-semiconductor field-effect transistor (MOSFET), and more specifically an n-channel MOSFET that includes gate electrode 242, source electrode 246, drain electrode 244, and body electrode 266 disposed n-well 268, e.g., as shown in FIG. 16. A length and width of detector 240 can be from 5 nm to 250 nm, specifically from 10 nm to 130 nm, and more specifically from 14 nm to 65 nm.

Molecular scrivener 200 can include substrate 264 on which elements (e.g., shielding electrodes, scrivener electrode, dielectric layers, and detector 240) are disposed as shown in FIG. 16 to FIG. 28. Substrate 264 can include silicon on insulator, silicon nitride, silicon oxide to provide support structures for the device structure and can be a semiconductor wafer material. Moreover, it will provide structural stability and a frame for sealing the device in the fluid-containing operating environment. A thickness of substrate 264 can be from 100 μm to 1 mm, specifically from 100 μm to 500 μm, and more specifically from 200 μm to 300 μm. A length and width of substrate 264 can be from 60 nm to 5 mm, specifically from 60 nm to 1 μm, and more specifically from 60 nm to 100 nm. In an embodiment, substrate 264 includes an oxide-coated silicon on insulator wafer. An aperture in substrate 264 communicates macromolecule 210 out of nanopore 280 and can have a size (i.e., a largest linear dimension orthogonal to a length of nanopore 280) from 1 nm to 100 nm, specifically from 1 nm to 20 nm, and more specifically from 1 nm to 10 nm.

Nanopore 280 communicates macromolecule 210 through molecular scrivener 200 and can be formed in electrodes and dielectric layers of by, e.g., focused ion beam (e.g., HO milling, dielectric breakdown, and the like. A size (i.e., a largest linear dimension orthogonal to a length of nanopore 280) can be from 1 nm to 100 nm, specifically from 2 nm to 20 nm, and more specifically from 2 nm to 5 nm.

Various power sources (e.g., 236, 238, 262, 282, 284) can be included in molecular scrivener 200 to provide notice to elements therein. A voltage from the power sources independently can be from −20 V to 20 V, specifically from −1.5 V to 1.5 V, and more specifically from −500 mV to 500 mV. An electric current from the power sources independently can be from −500 mA to 500 mA, specifically from −1 μA to 1 μA, and more specifically from −10 nA to 10 nA. The power sources can independently provide direct current voltage or pulsed voltage in a waveform that varies temporally. Waveform independently can have a duty cycle from 0% to 100%, specifically from 0% to 10%, and more specifically from 0% to 1%. Moreover, the power source that is used in bias writing electrodes (212B, 212C) can be controlled to provide a selected waveform to selectively write bits to chosen moieties in macromolecule 210.

Figure 17:
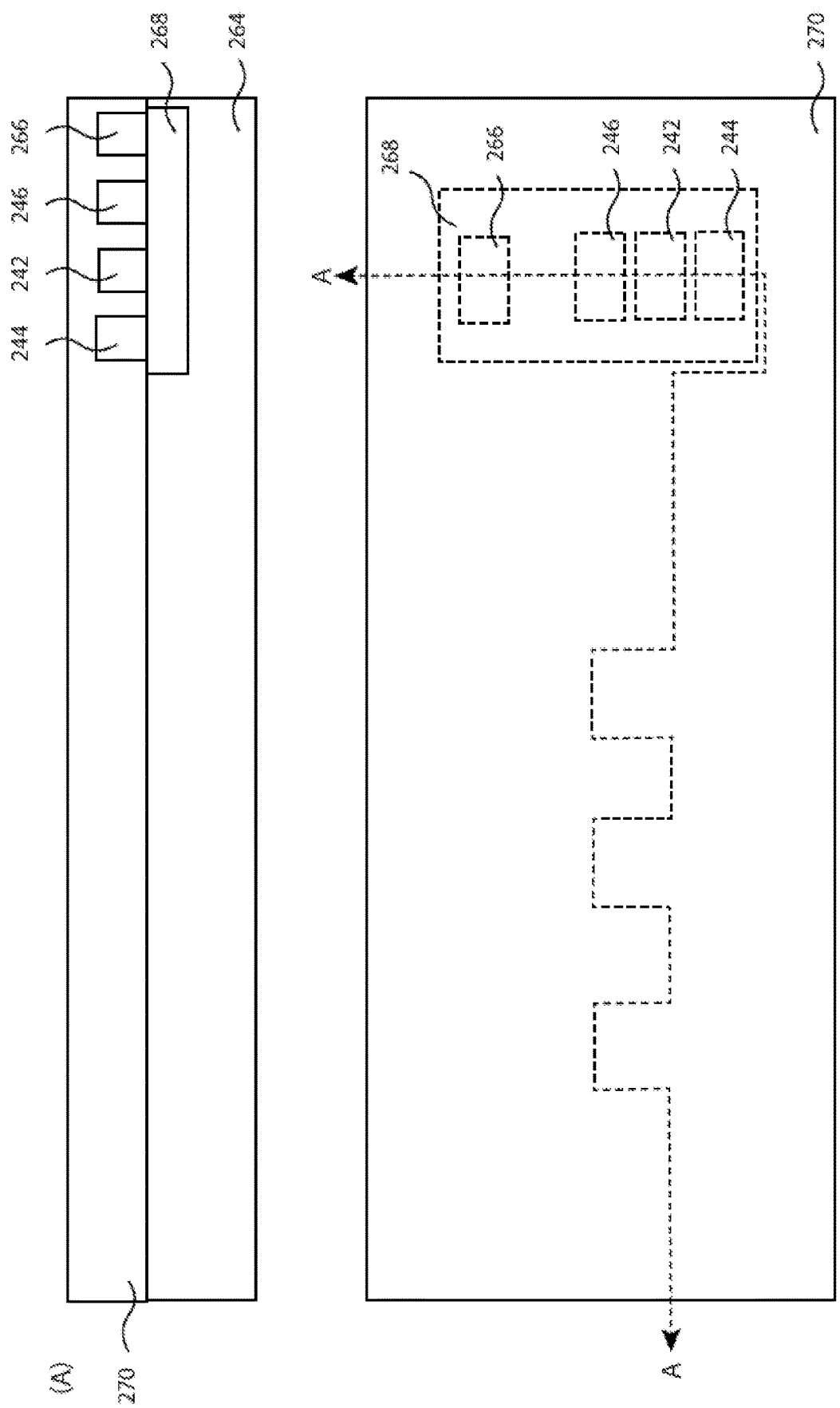
FIG. 17 shows a plan view of a dielectric layer formed on the substrate and detector shown in FIG. 16 that is involved in making a molecular scrivener in panel A, and panel B shows a cross-section along line A-A shown in panel A.
Figure 18:
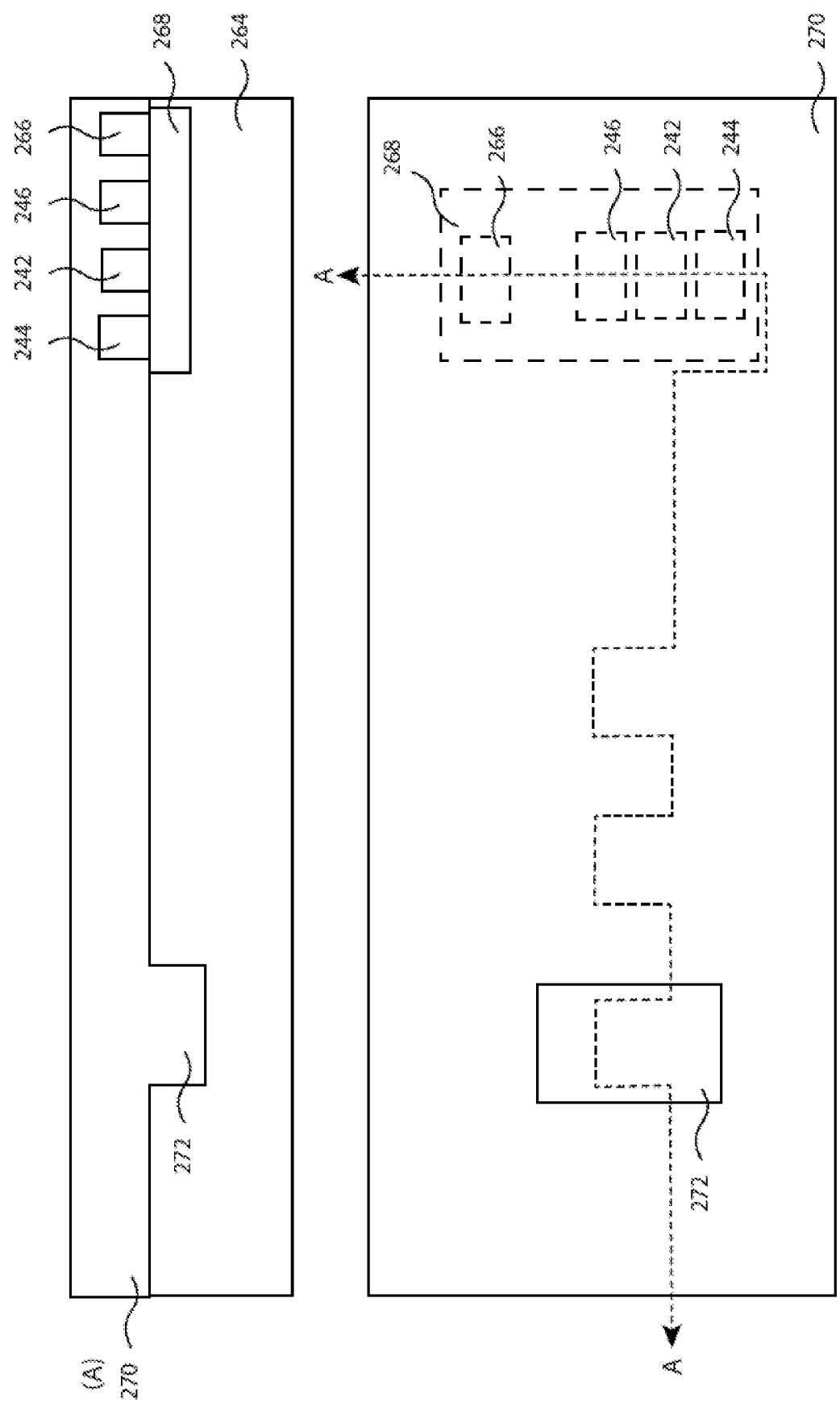
FIG. 18 shows a plan view of a trench formed in the dielectric layer and filled with the dielectric subsequent to planarization of the dielectric layer shown in FIG. 17 that is involved in making a molecular scrivener in panel A, and panel B shows a cross-section along line A-A shown in panel A.
Figure 19:
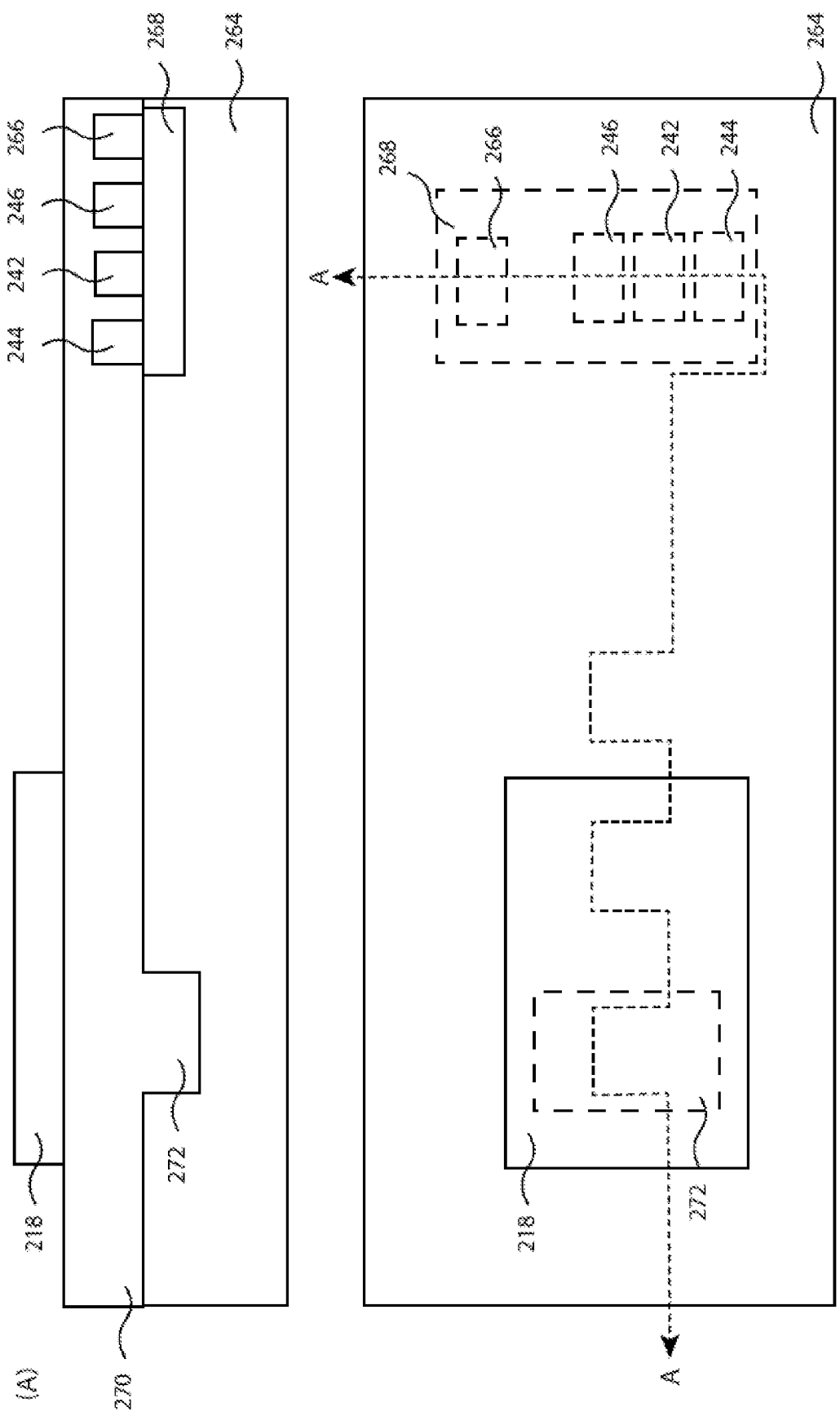
FIG. 19 shows a plan view of a second shielding electrode formed on the dielectric layer shown in FIG. 18 that is involved in making a molecular scrivener in panel A, and panel B shows a cross-section along line A-A shown in panel A.
Figure 20:
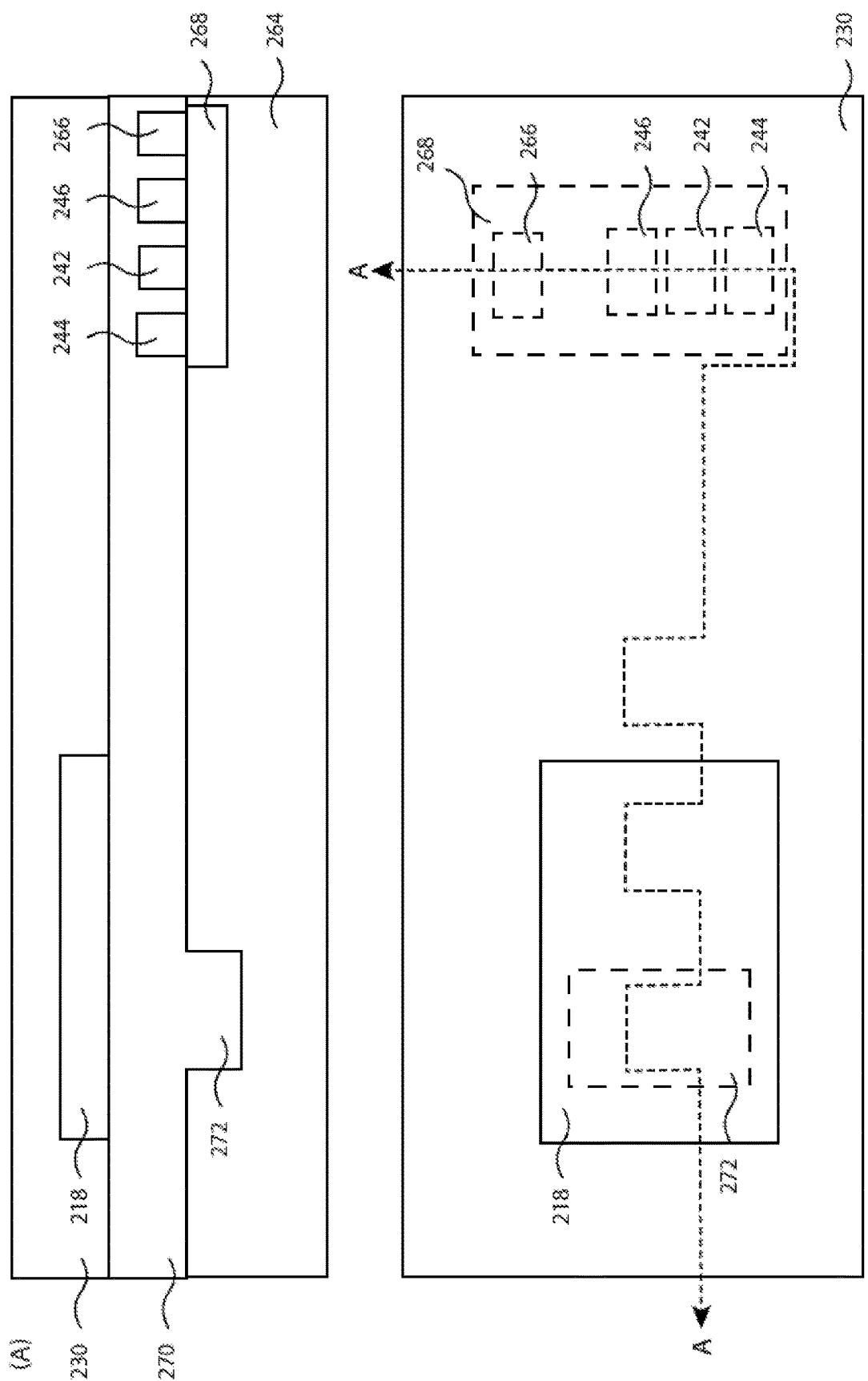
FIG. 20 shows a plan view of a dielectric layer formed on the second shielding electrode shown in FIG. 19 that is involved in making a molecular scrivener in panel A, and panel B shows a cross-section along line A-A shown in panel A.
Figure 21:
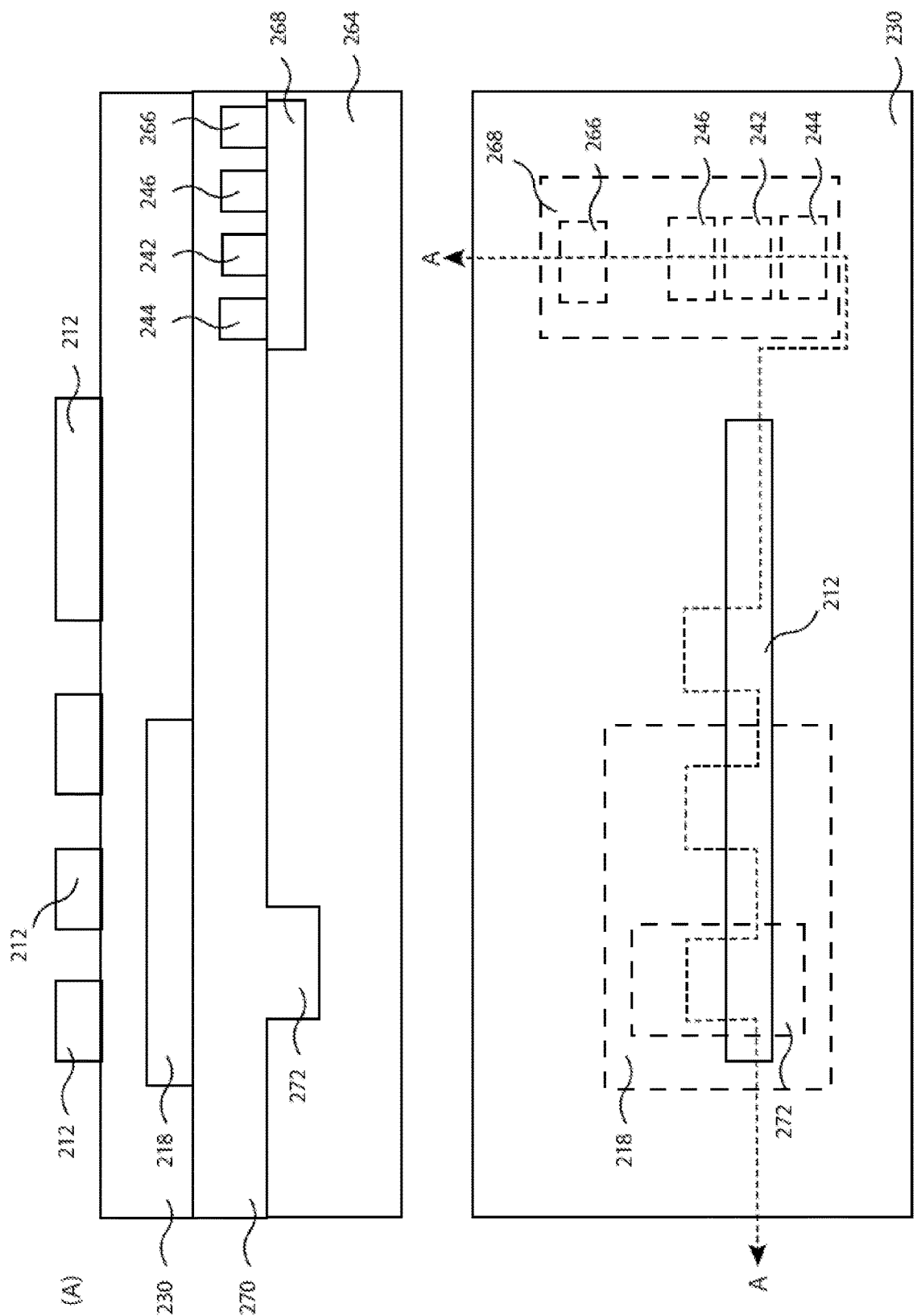
FIG. 21 shows a plan view of a scrivener electrode formed on the dielectric layer shown in FIG. 20 that is involved in making a molecular scrivener in panel A, and panel B shows a cross-section along line A-A shown in panel A.
Figure 22:
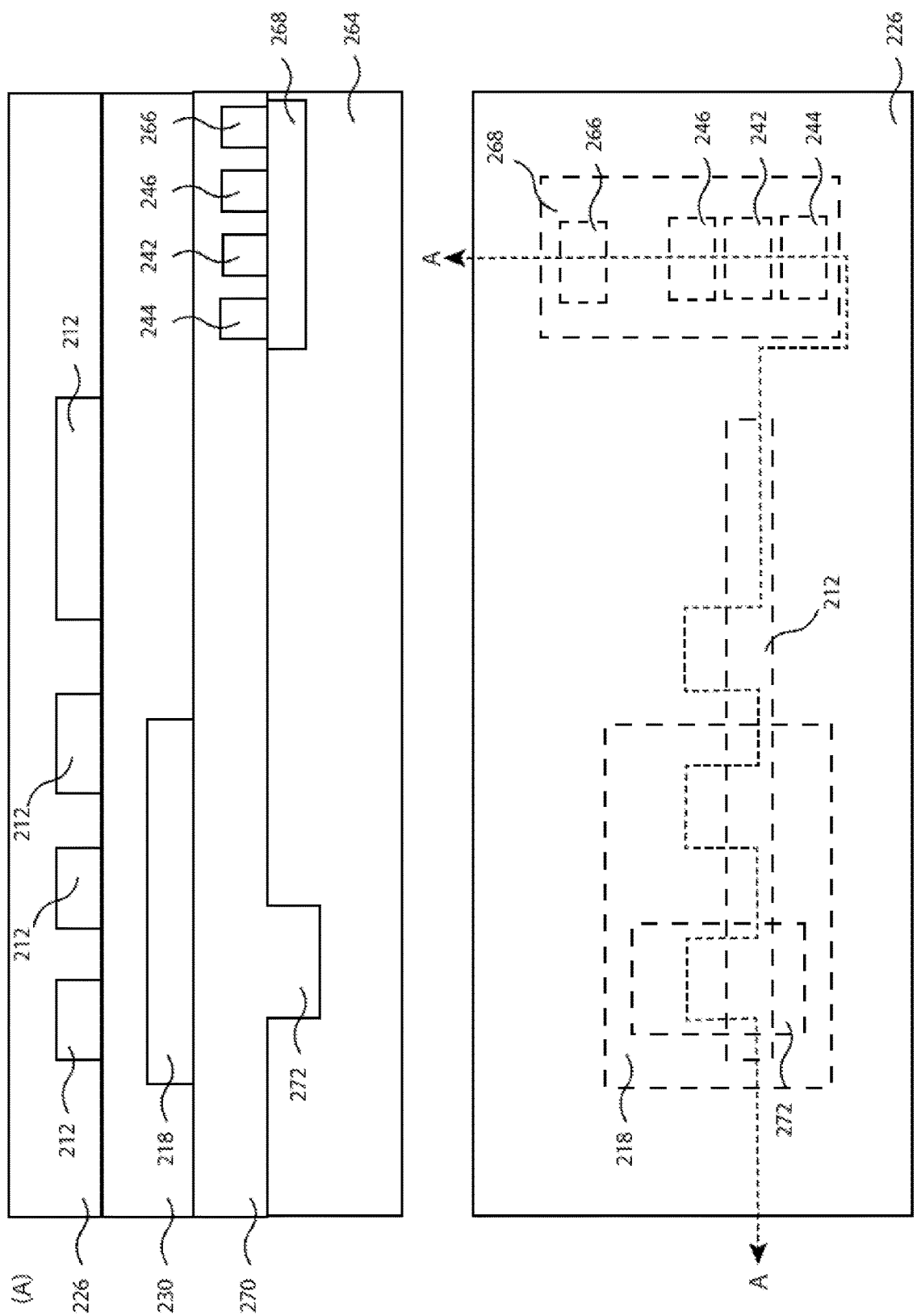
FIG. 22 shows a plan view of a dielectric layer formed on the scrivener electrode shown in FIG. 21 that is involved in making a molecular scrivener in panel A, and panel B shows a cross-section along line A-A shown in panel A.
Figure 23:
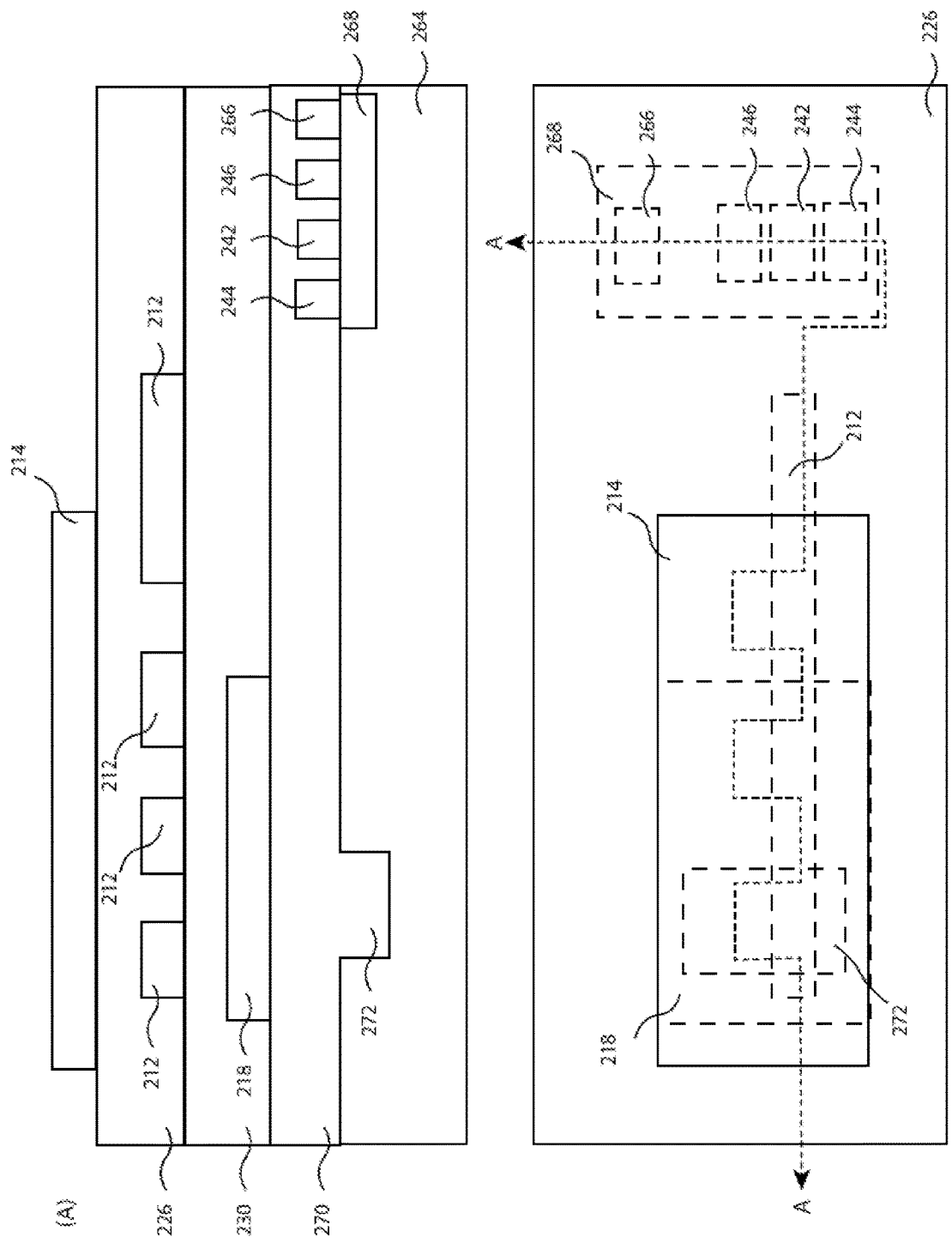
FIG. 23 shows a plan view of a first shielding electrode formed on the dielectric layer disposed on the scrivener electrode shown in FIG. 22 that is involved in making a molecular scrivener in panel A, and panel B shows a cross-section along line A-A shown in panel A.
Figure 24:
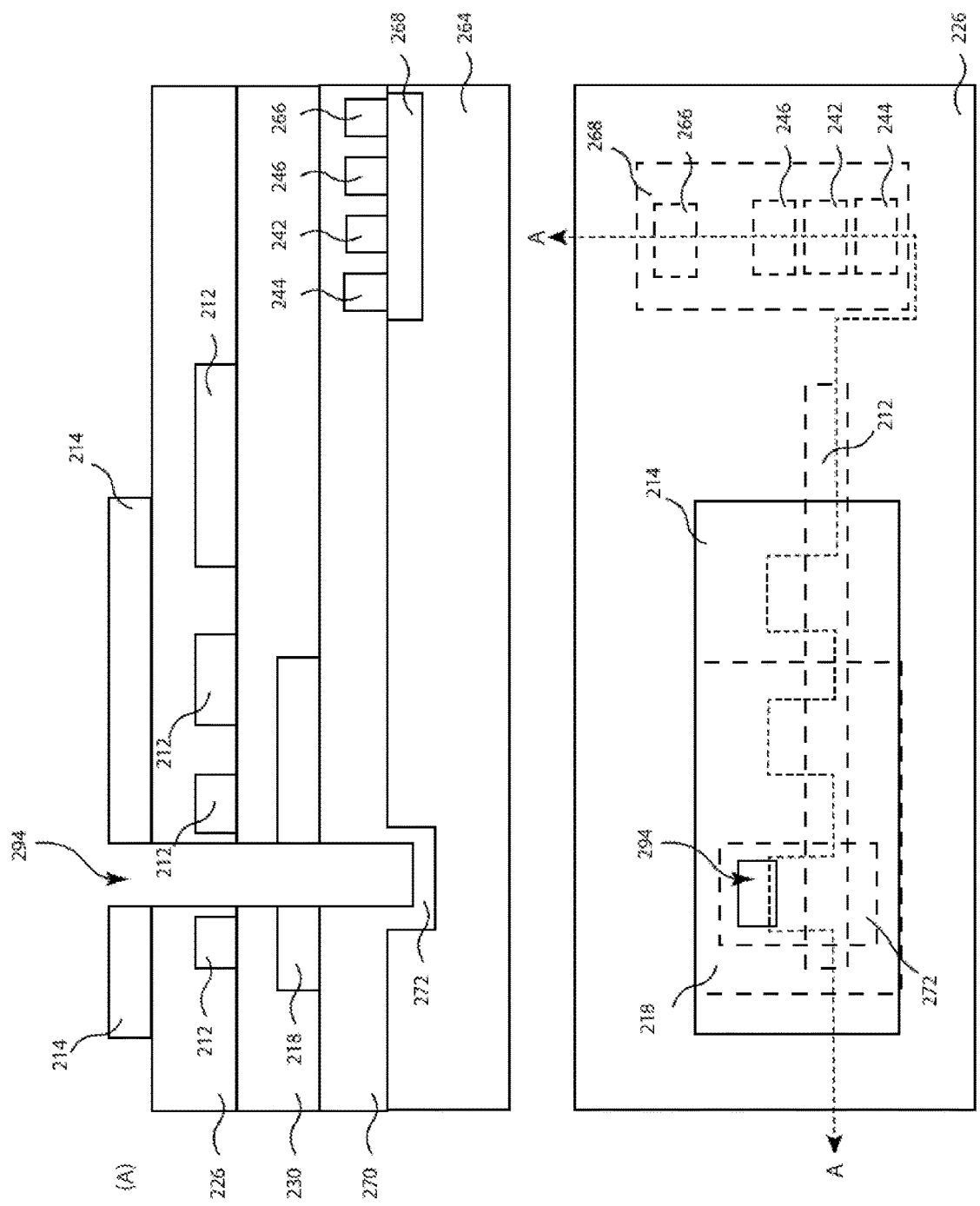
FIG. 24 shows a plan view of a via formed in the first shielding electrode, the second shielding electrode, and several dielectric layers shown in FIG. 23 that is involved in making a molecular scrivener in panel A, and panel B shows a cross-section along line A-A shown in panel A.
Figure 25:
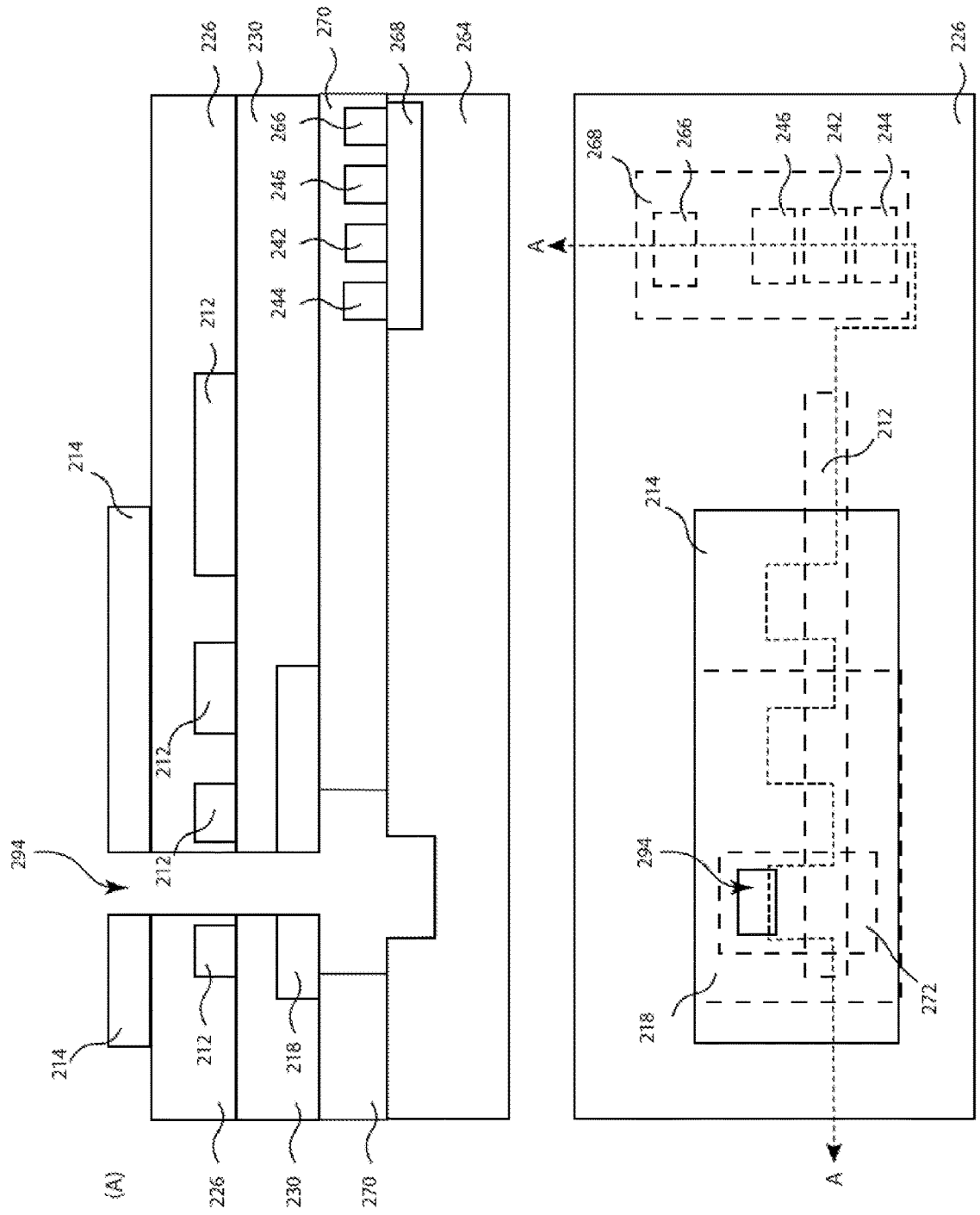
FIG. 25 shows a plan view of a cavity formed in the trench by removing some of the dielectric shown in FIG. 24 that is involved in making a molecular scrivener in panel A, and panel B shows a cross-section along line A-A shown in panel A.
Figure 26:
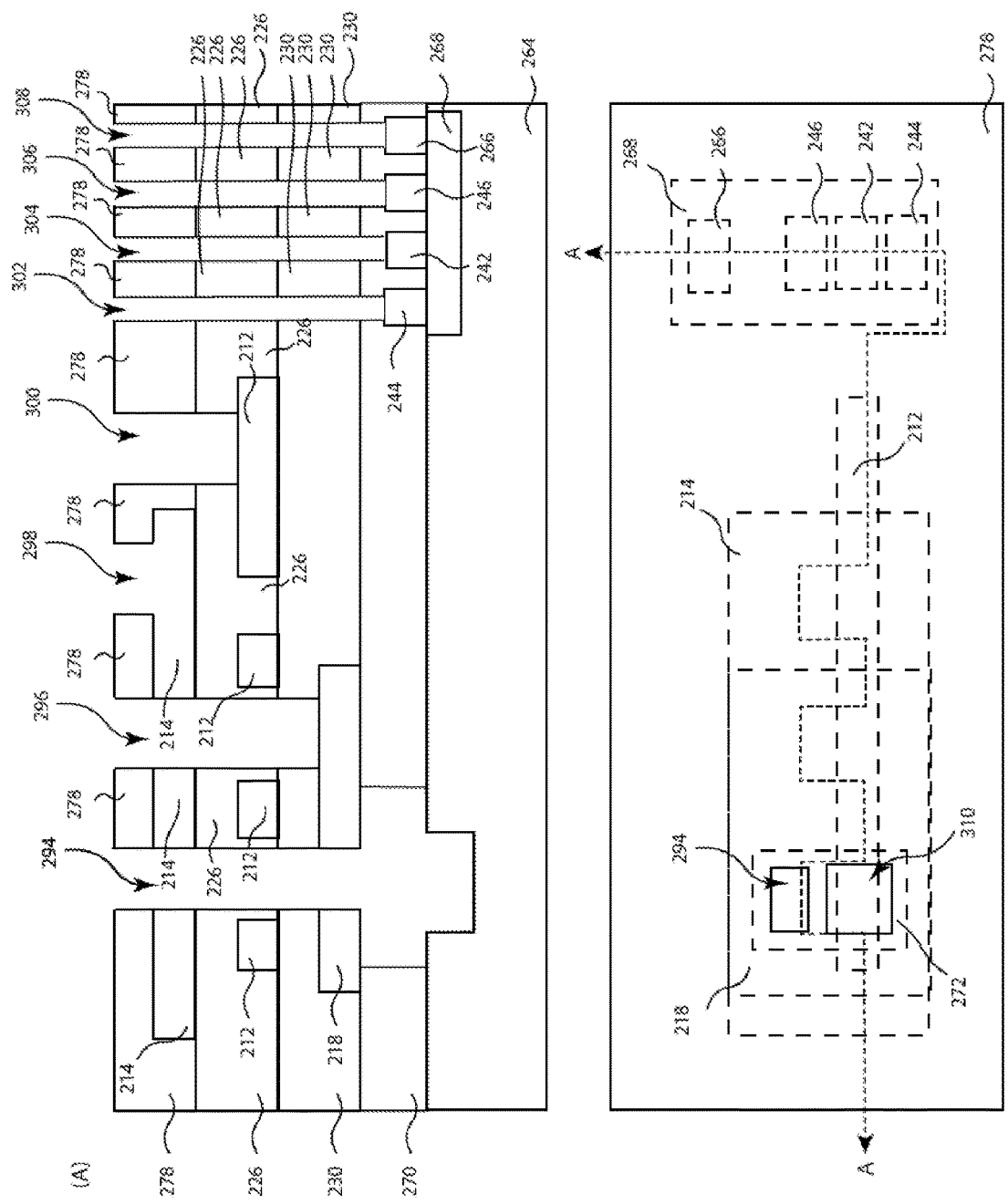
FIG. 26 shows a plan view of a dielectric layer formed on the first shielding electrode with a plurality of vias formed therein that expose several of the electrodes shown in FIG. 25 that is involved in making a molecular scrivener in panel A, and panel B shows a cross-section along line A-A shown in panel A.
Figure 27:
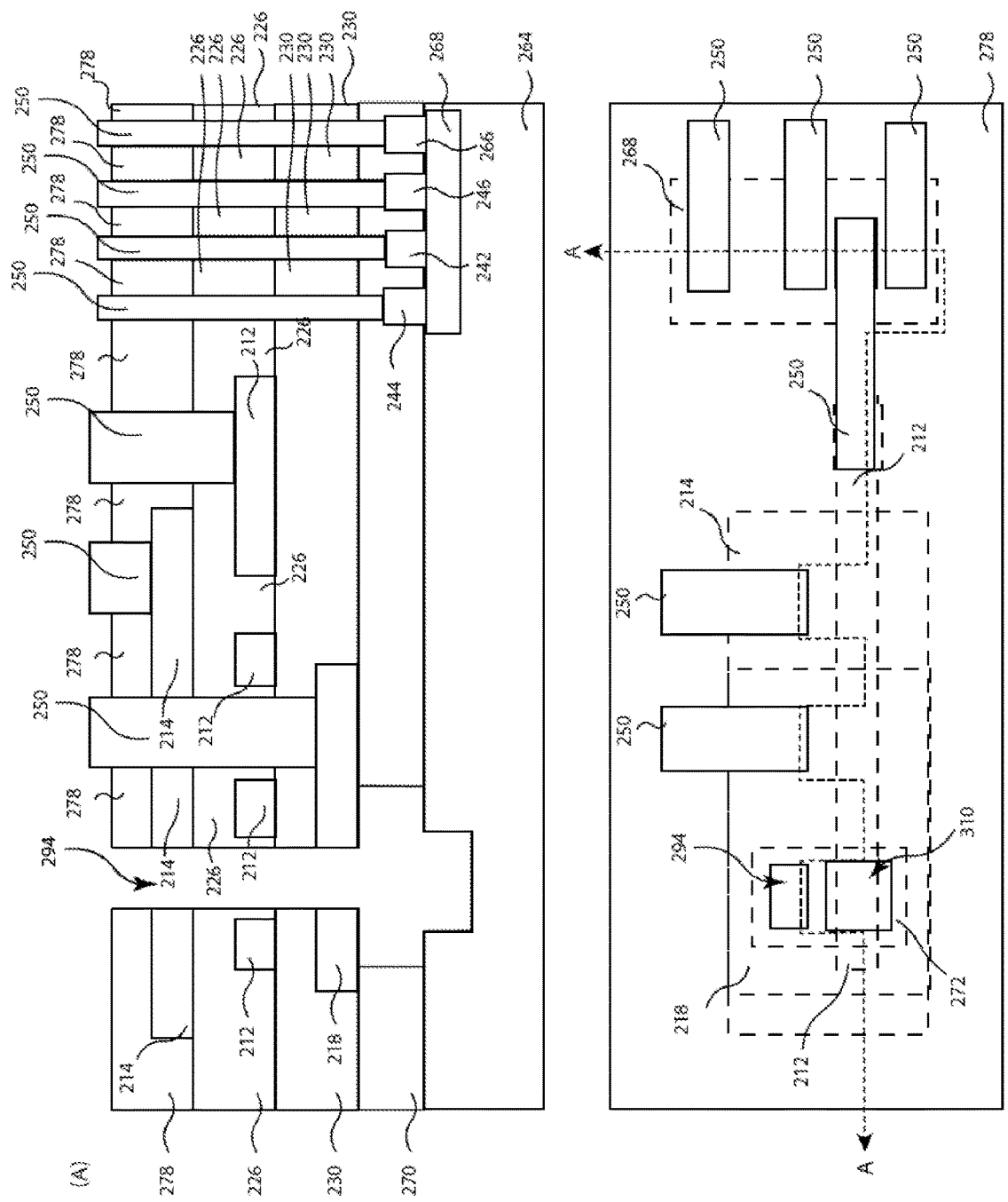
FIG. 27 shows a plan view of electrical conductors formed in the vias of the dielectric layer shown in FIG. 26 that is involved in making a molecular scrivener in panel A, and panel B shows a cross-section along line A-A shown in panel A.
Figure 28:
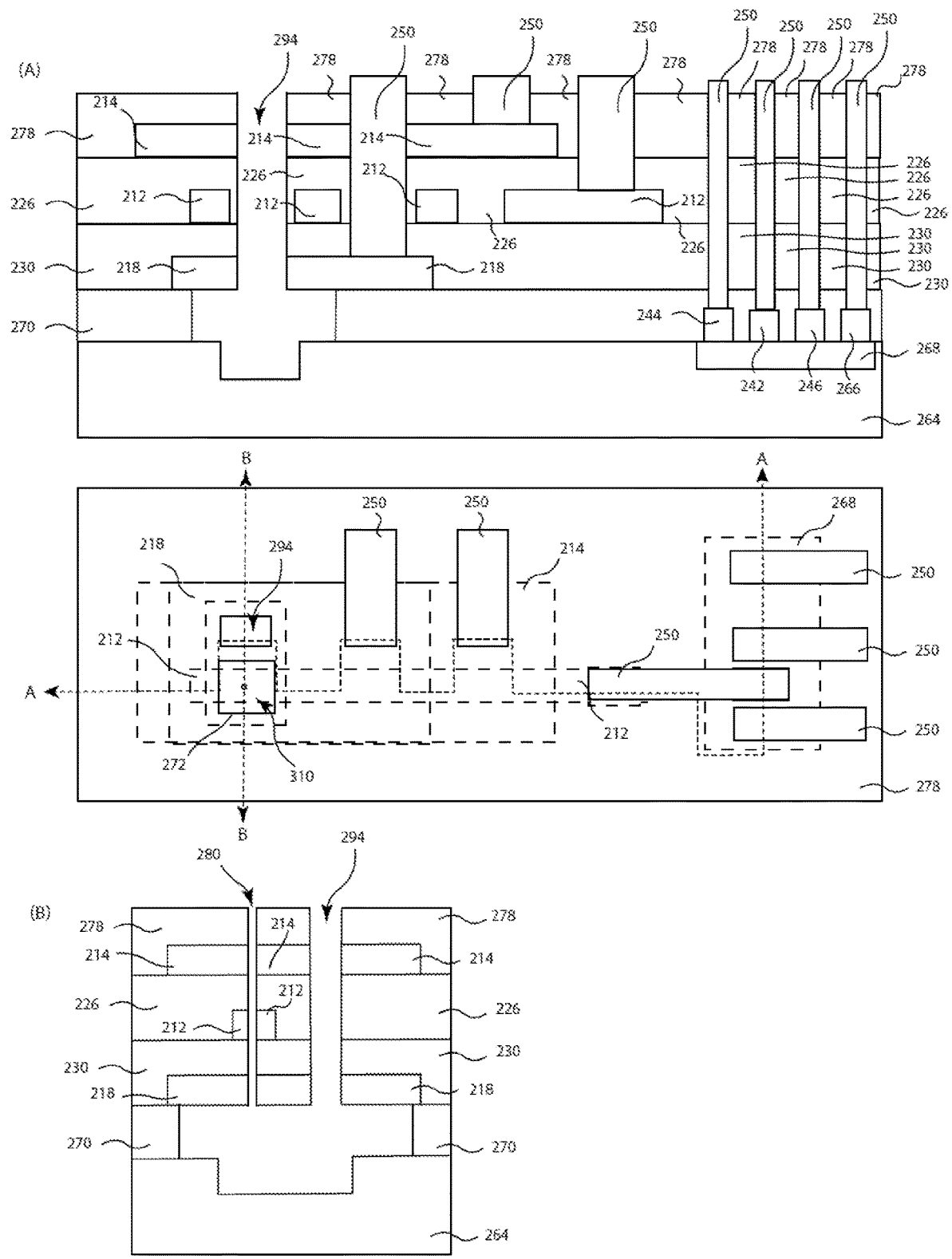
FIG. 28 shows a plan view of the nanopore formed in the shielding electrodes, scrivener electrodes, and a portion of the dielectric layers shown in FIG. 27 that is involved in making a molecular scrivener in panel A, and panel B shows a cross-section along line A-A shown in panel A.

Molecular scrivener 200 can be made in various ways. In an embodiment, with reference to FIG. 16 to FIG. 28, a process for making molecular scrivener 200 includes forming detector 240 on substrate 264 by silicon integrated circuit production processing as shown in FIG. 16. As shown in FIG. 17, dielectric layer 270 is formed on substrate 264 and detector 240 by Plasma-enhanced chemical vapor deposition process (PECVD). As shown in FIG. 18, trench 272 is formed in substrate 264 and dielectric layer 270 by Reactive ion etching (ME). Trench 272 is subsequently filled with dielectric material by PECVD, and dielectric layer 270 is planarized by chemical-mechanical polishing (CMP). As shown in FIG. 19, second shielding electrode 218 is formed on dielectric layer 270 by chemical vapor deposition (CVD), and second shielding electrode 218 is patterned by RIE. As shown in FIG. 20, dielectric layer 230 is formed on second shielding electrode 218 and dielectric layer 270 by PECVD. As shown in FIG. 21, scrivener electrode 212 is formed on dielectric layer 230 by CVD, and scrivener electrode 212 is patterned by ME. As shown in FIG. 22, dielectric layer 226 is formed on scrivener electrode 212 and dielectric layer 230 by PECVD. As shown in FIG. 23, first shielding electrode 214 is formed on dielectric layer 226 by CVD and then RIE. As shown in FIG. 24, via 274 is formed through first shielding electrode 214, dielectric layer 226, dielectric layer 230, second shielding electrode 218, and dielectric layer 270 by RIE. As shown in FIG. 25, dielectric layer is subjected etching to remove dielectric material from trench 272 to form cavity 276 under portions of the first shielding electrode 214, scrivener electrode 212, and second shielding electrode 218 by timed wet etching. As shown in FIG. 26, dielectric layer 278 is formed on first shielding electrode 214 and dielectric layer 226 by PECVD. Dielectric layer 278 is subjected to removal of selected portions to form via 294, via 296, via 298, via 300, via 302, via 304, via 306, and via 308 by RIE. As shown in FIG. 27, electrical conductor 250 or formed and patterned in via 296, via 298, via 300, via 302, via 304, via 306, and via 308 by ME.

In an embodiment, molecular scrivener 200 can be made by fabricating detector 240 by silicon integrated circuit processing in a silicon integrated circuit processing facility, and a recess area 272 is formed next to detector 240. This area is filled back with dielectric layer 270. A thin conductive layer is then grown, e.g., deposited, and then etched to form second shield electrode 218. Thin dielectric layer 230 is then deposited. Atomic thin conductive layer is grown next and patterned into scrivener electrode 212. Another thin dielectric layer 226 is deposited next. Another thin conductive layer is then deposited (or grown) and patterned to form first shield electrode 214. Another dielectric layer is then deposited. A number of contact holes are then formed to enable contact to electrodes and terminals of detector 240. Metal deposition and patterning creates contact pads for external contacts to shield electrodes and source, drain, substrate terminals of detector 240, as well as bridging the gate terminal of detector 240 to the scrivener electrode. Access hole 294 is then formed by etching down to the recess area. A wet etch process selectively etch the dielectric of layer 270 for a controlled amount by timed etch. Finally, the nanopore is drilled through from the top to the bottom recess area.

In an embodiment, molecular scrivener 200 can be made by fabricating detector 240 by silicon integrated circuit processing in a silicon integrated circuit processing facility, and recess area 272 is formed next to detector 240. This area is filled back with dielectric layer 270. A thin conductive layer is then grown (or deposited) and then etched to form the second shield electrode 218. Thin dielectric layer 230 is then deposited. Atomic thin conductive layer is grown next and then patterned into the scrivener electrode 212A. Another thin dielectric layer 226 is deposited next. Another thin conductive layer is then deposited (or grown) and patterned to form the first shield electrode 214A. Another thin dielectric layer 226 is then deposited. Next is to deposit (or grow) another thin conductive layer and pattern it into writing electrodes 212B and 212C. Another thin dielectric layer 226 is deposited. Then another thin conductor layer is deposited (or grown) and patterned into the top shield electrode 214B.

In an embodiment, molecular scrivener 200 can be made by fabricating detector 240 by silicon integrated circuit processing in a silicon integrated circuit processing facility, and recess area 272 is formed next to detector 240. This area is filled back with dielectric layer 270. A thin conductive layer is then grown (or deposited) and then etched to form the second shield electrode 218. Thin dielectric layer 230 is then deposited. Atomic thin conductive layer is grown next and then patterned into the scrivener electrode 212A. Another thin dielectric layer 226 is deposited next. Another thin conductive layer is then deposited (or grown) and patterned to form the first shield electrode 214A. Another thin dielectric layer 226 is then deposited. Next is to deposit (or grow) another thin conductive layer and pattern it into writing electrodes 212B and 212C. Another thin dielectric layer 226 is deposited. Then another thin conductor layer is deposited (or grown) and patterned into the top shield electrode 214B. A number of contact holes are then formed to enable contact to all electrodes and terminals of detector 240. Metal deposition and patterning creates contact pads for external contacts to shield electrodes, write electrodes and source, drain, substrate terminals of detector 240, as well as bridging the gate terminal of detector 240 to the scrivener electrode. A wet etch process selectively etch the dielectric of layer 270 for a controlled amount by timed etch. Finally, the nanopore is drilled through from the top to the bottom recess area.

Molecular scrivener 200 has numerous advantageous and unexpected benefits and uses. In an embodiment, a process for reading data from or writing data to macromolecule 210 with molecular scrivener 200 includes: receiving macromolecule 210 in nanopore 280 at first shielding electrode 214, macromolecule 210 including a plurality of moieties, wherein the moieties include neutral moiety 223, charged moiety 224, dipolar moiety 225, or a combination thereof; electrostatically shielding scrivener electrode 212 with first shielding electrode 214 and second shielding electrode 218; communicating, in nanopore 280, macromolecule 210 from first shielding electrode 214 to scrivener electrode 212; sequentially receiving, in nanopore 280 at scrivener electrode 212, individual moieties of macromolecule 210 so that third potential V3 of scrivener electrode 212 responds to individual moieties in macromolecule 210. Scrivener electrode 212 responds to individual moieties in macromolecule 210 by: electrically floating, in an absence of charged moiety 224 or dipolar moiety 225 of macromolecule 210, at third potential V3 such that third potential V3 is intermediate between first potential V1 and second potential V2; changing, in a presence of charged moiety 224 of macromolecule 210, third potential V3 from the intermediate potential to electrically read the presence of charged moiety 224; and changing, in a presence of dipolar moiety 225 of macromolecule 210, third potential V3 from the intermediate potential to electrically read the presence of dipolar moiety 225. The process also includes communicating, in nanopore 280, macromolecule 210 from scrivener electrode 212 to second shielding electrode 218; and communicating macromolecule 210 from nanopore 280 at second shielding electrode 218 to expel macromolecule 210 from nanopore 280.

The process can include making a composition that includes macromolecule 210 disposed in an electrolytic fluid or dielectric fluid; introducing the composition in compartment 290 of container 288 in which molecular scrivener 200 separates compartment 290 from compartment 292 via nanopore 280. First shielding electrode 214 and second shielding electrode 218 can be grounded to shield scrivener electrode 212 from external electric fields, e.g., from the electrolytic fluid, compartment 290, compartment 292, and the like. Macromolecule 210 is communicated through nanopore 280 with an external electric field produced by migration electrodes 286 that are disposed in compartment 290 and compartment 292 of container 288. Detector 240 is controlled to operate in a sub-threshold region or the peak transconductance region, and drain current is read at a high bandwidth, e.g., 0.1 GHz or greater. When individual moieties of macromolecule 210, electric charge or dipole, e.g., from charged moiety 224 or dipolar moiety 225 change third potential V3 of scrivener electrode 212. A change in third potential V3 of scrivener electrode 212 changes electrical current flowing detector 240, e.g., at source electrode 246 or drain electrode 244, to determine the presence or identity of a molecular species of the individual moiety (e.g., 223, 224, 225) of macromolecule 210 in nanopore 280 at scrivener electrode 212. It is contemplated that time-resolved fluctuation in electrical current at detector 240 provides a unique fingerprint for electrostatic fields around the moiety at scrivener electrode 212. When macromolecule 210 is a nucleic acid containing a plurality of nuclear bases, fluctuation of electrical current from detector 240 is proportional to a dipole moment of the nucleobase. For nucleobase's guanine (G), cytosine (C), a thymine (T), adenine (A), and uracil (U), a magnitude of electrical current (I) produced by detector 240 is in an order as follows: I(G)~I(C), >I(T)>I(A). It should be appreciated that this order is due to the relative magnitude of the permanent electric dipole moment in the nucleobases and a change in third voltage V3 produced by the nucleobases arranged in macromolecule 210 as dipolar moieties 225. It is contemplated that macromolecule 210 can be a linear polymer with segments that produce a unique current signature, DNA or a polymer with discrete charges or dipole moments along a backbone of the polymer, molecular scrivener 200 decodes digital information by decoding the electrical current with chemical identity of the segment passing through nanopore 280 in the aperture of scrivener electrode 212.

In an embodiment, a process for reading data from or writing data to macromolecule 210 with molecular scrivener 200 includes: receiving macromolecule 210 in nanopore 280 at third shielding electrode 214B; electrostatically shielding first writing electrode 212B and second writing electrode 212C with third shielding electrode 214B and first shielding electrode 214A; communicating, in nanopore 280, macromolecule 210 from third shielding electrode 214B to between first writing electrode 212B and second writing electrode 212C; sequentially receiving, in nanopore 280 between first writing electrode 214 and second writing electrode 218, individual moieties of macromolecule 210; communicating macromolecule 210 from first writing electrode 212B and second writing electrode 212C to scrivener electrode 212A through nanopore 280 in first shielding electrode 214A; shielding scrivener electrode 212 by first shielding electrode 214A and second shielding electrode 218; receiving, in nanopore 280 at scrivener electrode 212, individual moieties of macromolecule, so that third potential V3 of scrivener electrode 212 responds to individual moieties in macromolecule 210 by: electrically floating, in an absence of charged moiety 224 or dipolar moiety 225 of macromolecule 210, scrivener electrode 212A at third potential V3 such that third potential V3 is intermediate between first potential V1 and second potential V2; changing, in a presence of charged moiety 224 of macromolecule 210, third potential V3 from the intermediate potential to electrically read presence of charged moiety 224; and changing, in a presence of dipolar moiety 225 of macromolecule 210, third potential V3 from the intermediate potential to electrically read the presence of dipolar moiety 225; communicating macromolecule 210 from nanopore 280 at scrivener electrode 212A to nanopore 280 at second shielding electrode 218; and communicating macromolecule 210 from nanopore 280 at second shielding electrode 218 to expel macromolecule 210 from nanopore 280.

The process can include, when sequentially receiving, in nanopore 280 between first writing electrode 212B and second writing electrode 212C, individual moieties of macromolecule 210: producing, by first writing electrode 212B and second writing electrode 212C, a writing potential by: receiving, by first writing electrode 212B, fourth potential V4; and receiving, by second writing electrode 212C, fifth potential V5, wherein the writing potential is a potential difference between fourth potential V4 and fifth potential V5; subjecting a first moiety of macromolecule 210 to the writing potential; changing a charge of the first moiety of macromolecule 210 in response to the writing potential; communicating the first moiety from first writing electrode 212B and second writing electrode 212C to scrivener electrode 212A; and changing third potential V3 of scrivener electrode 212A to detect the first moiety by scrivener electrode 212A if the first moiety, after changing the charge of the first moiety by the writing potential, is charged or dipolar. It is contemplated that, in the process for reading data from or writing data to macromolecule 210 with molecular scrivener 200, macromolecule 210 is subjected to a digitally-encoded pulsed voltage from writing electrodes (212A, 212B).

The process for writing or encoding information (charges) into molecule can further include the use of chemical reactions that are activated by the writing potential of writing electrodes 212A and 212B. It is contemplated that, in the process for stabilizing the encoded macromolecule 210, the moiety that is altered by the writing electrodes will be fixed by an activated chemical reaction rendering the moiety inactive for further reactions.

Figure 29:
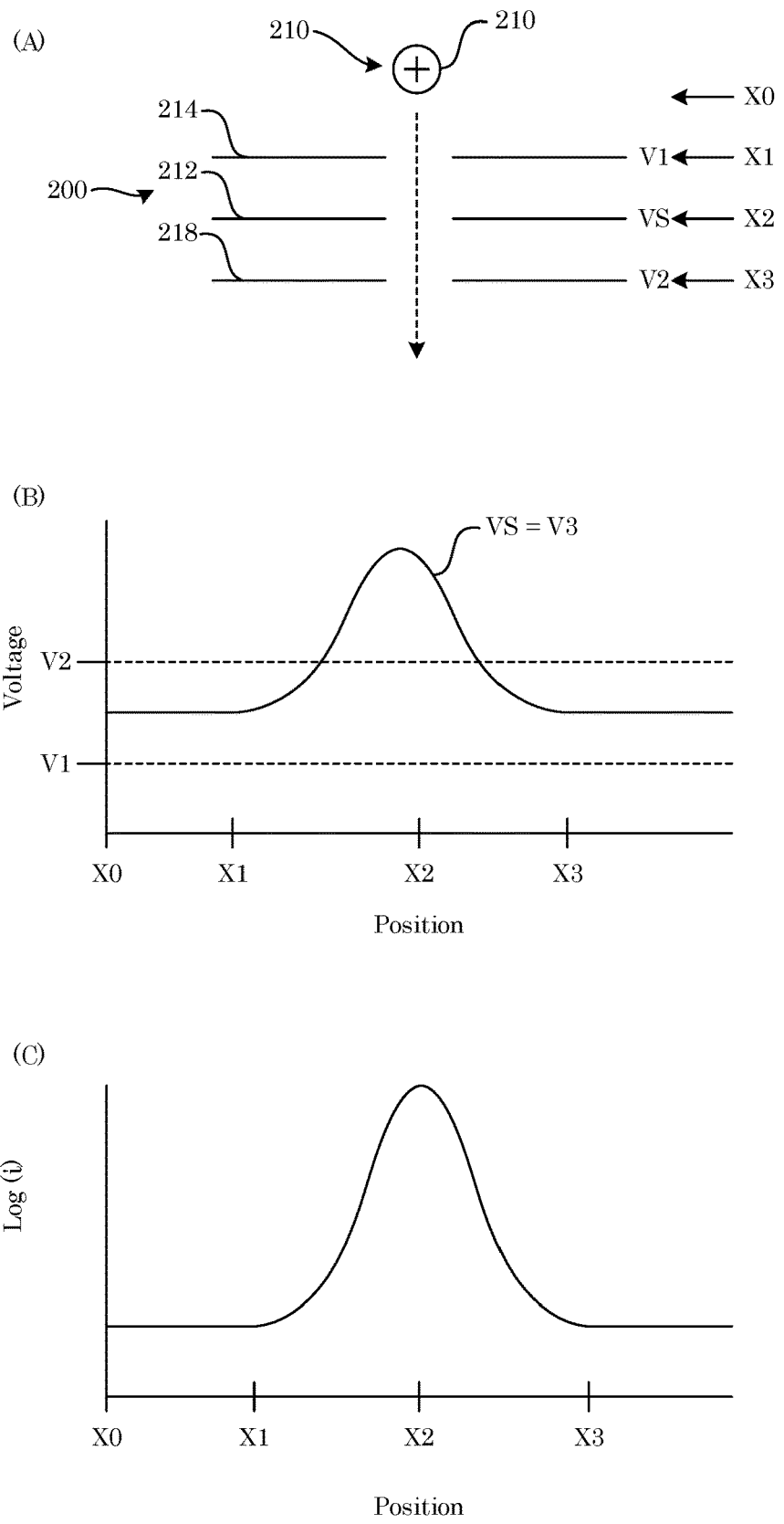
FIG. 29 shows in panel A a position of a charged moiety relative to electrodes in a molecular scrivener, in panel B a graph of voltage versus position, and in panel C a graph of the logarithm of current versus position.

In reading moieties in macromolecule 210, with reference to FIG. 29, charged moiety 224 of macromolecule 210 can be initially disposed at position X0 relative to first shielding electrode 214 (disposed at position X1), second shielding electrode 218 (disposed at position X3), and scrivener electrode (disposed at position X2) that are respectively at first potential V1, second potential V2, and third potential V3 given as scrivener voltage VS, wherein first potential V1 is greater than second potential V2 such that scrivener voltage VS is between first potential V1 and second potential V2, as shown in panels A, B, and C. As charge moiety 224 moves from position X0 to position X1, scrivener voltage VS maintains its value intermediate between first potential V1 and second potential V2. As charge moiety 224 moves from position X1 to position X2, scrivener voltage VS increases, and scrivener voltage VS obtains greatest magnitude when charge moiety 224 is at position X2. Thereafter, as charge moiety 224 moves from position X2 to position X3, scrivener voltage VS decreases and approaches the intermediate value. As charge moiety 224 moves from position X2 and beyond, scrivener voltage VS maintains the intermediate value.

Reading a presence of moieties in macromolecule 210 is shown in panel A of FIG. 30 for macromolecule 210 that have, e.g., covalently bonded neutral moieties 223, charge moieties 224, and dipolar moieties 225. Here, Scrivener voltage VS increases due to electrostatic interaction of scrivener electrode 212 and individual moieties. It is contemplated that neutral moieties can produce some change in third potential V3 via weak interactions, e.g., produced by a quadrupole moment in neutral moiety 223 as shown for moiety M1, M3, and M4, while some neutral moieties may not change third potential V3 as shown for moiety M2. Greater change of third potential V3 occurs for dipolar moieties 225 as shown for dipolar moieties D1, D2, D3, and D4. Even greater changes in third potential V3 occur for charged moieties 224 as shown for positive charged moieties C1 and C2. Further, with reference to panel B of FIG. 30, a nucleic acid macromolecule such as DNA can have a sequence such as T-A-G-A-T-C that produce a change in third potential V3 shown as scrivener voltage VS for each nucleobase. Here, adenine, thymine, guanine have increasingly larger changes in scrivener voltage, and scrivener voltage VS produced in a presence of cytosine is close to that for guanine. Uracil and nucleobase derivatives also produce changes in third potential V3.

With reference to FIG. 31, panel A an initial sequence of moieties in macromolecule 210 that are subjected to write voltages having amplitudes shown in the waveform below macromolecule 210, wherein moiety M2 is charged moiety 224 that is subjected to a write potential pulse P1 produced as a potential difference between fourth potential V4 of first writing electrode 212B and fifth potential V5 of second writing electrode 212C. Moiety M3 is neutral moiety 223 that is subjected to write potential pulse P2, and moiety M6 is charged moiety 224 subjected to write potential pulse P3. As result of potential pulses P1, P2, P3, as shown in panel B, moiety M2 is converted to neutral moiety 223; moiety M3 is converted to negatively charged moiety 224, and moiety M6 is converted to neutral moiety 223. Further, each moiety in converted macromolecule 210A in panel B is read as shown in the graph, wherein neutral moieties produce a substantially similar scrivener voltage VS; negatively charged moieties produce a negative-going scrivener voltage relative to that for neutral moieties, and positively charged moieties produce a positive-going scrivener voltage relative to that for neutral moieties.

Molecular scrivener 200 and processes disclosed herein have numerous beneficial uses, including protein identification and quantification, DNA and protein sequencing, and hardware for molecular computer memory. Advantageously, molecular scrivener 200 overcomes limitations of technical deficiencies of conventional articles such as bandwidth, chemical selectivity, discrimination of similar objects, and insufficient signal to noise ratio. Because the measurement of charge is rapid and made at the nanometer-scale, the device also overcomes inaccuracies in identifying proteins due to diffusional broadening.

Moreover, molecular scrivener 200 and processes herein have numerous advantageous properties. In an aspect, the technology is scalable and can be operated in arrays.

Molecular scrivener 200 and processes herein unexpectedly measures charges within macromolecules at high spatial resolution and at the single electron charge limit. Moreover, molecular scrivener 200 determines the location of charged amino acid residues within a folded or denatured protein, and thereby identify proteins based on the location of charged amino acid residues within folded or denatured proteins. In an analogy to 2D gel electrophoresis, further discrimination of proteins by molecular scrivener 200 is made possible by measuring the locations of charged amino acid residues as a function of pH. The articles and processes herein are illustrated further by the following Example, which is non-limiting.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A molecular scrivener 200 for reading data from or writing data to a macromolecule 210, the molecular scrivener 200 comprising:
 a pair of shielding electrodes comprising:
  a first shielding electrode 214 comprising a first transmission aperture 216 bounded by the first shielding electrode 214 and that:
   receives a first potential V1; and
   receives and communicates the macromolecule 210 through the first transmission aperture 216 in presence of the first potential V1; and
  a second shielding electrode 218 comprising a second transmission aperture 220 bounded by the second shielding electrode 218 and that:
   receives a second potential V2; and
   receives and communicates the macromolecule 210 through the second transmission aperture 220,
   the second transmission aperture 220 being in fluid communication with and aligned with first transmission aperture 216, and
   the second transmission aperture 220 being spaced apart from the first transmission aperture 216;
 a scrivener electrode 212 comprising a third transmission aperture 222 bounded by the scrivener electrode 212 and that:
  is interposed between the first shielding electrode 214 and the second shielding electrode 218;
  electrically floats at a third potential V3 such that, in an absence of a charged moiety 224 or a dipolar moiety 225 of the macromolecule 210, the third potential V3 is intermediate between the first potential V1 and the second potential V2; and
  receives the macromolecule 210 from the first shielding electrode 214;
  communicates the macromolecule 210 through the second transmission aperture 220 to the second shielding electrode 218; and
  the third potential V3 changes in a presence of the charged moiety 224 of the macromolecule 210 to electrically read the presence of the charged moiety 224;
  the third potential V3 changes in a presence of the dipolar moiety 225 of the macromolecule 210 to electrically read the presence of the dipolar moiety 225;
  the third transmission aperture 222 being in fluid communication with and aligned with first transmission aperture 216, and
  is spaced apart from the first shielding electrode 214 and the second shielding electrode 218;
 a first dielectric layer 226 interposed between the first shielding electrode 214 and the scrivener electrode 212 and that electrically isolates the first shielding electrode 214 and the scrivener electrode 212, the first dielectric layer 226 comprising a fourth transmission aperture 228 bounded by the first dielectric layer 226 and that:
  receives the macromolecule 210 from the first shielding electrode 214; and
  communicates the macromolecule 210 through the fourth transmission aperture 228 to the scrivener electrode 212, and the fourth transmission aperture 228 being in fluid communication with and aligned with first transmission aperture 216;

a second dielectric layer 230 interposed between the scrivener electrode 212 and the second shielding electrode 218 and that electrically isolates the second shielding electrode 218 and the scrivener electrode 212, the second dielectric layer 230 comprising a fifth transmission aperture 232 bounded by the second dielectric layer 230 and that:

receives the macromolecule 210 from the scrivener electrode 212; and communicates the macromolecule 210 through the fifth transmission aperture 232 to the second shielding electrode 218, and the fifth transmission aperture 232 being in fluid communication with and aligned with first transmission aperture 216; and a nanopore that comprises the transmission apertures.

2. The molecular scrivener 200 of claim 1, further comprising a first power source 236 in electrical communication with the first shielding electrode 214 and that provides a first potential to the first shielding electrode 214 such that first shielding electrode 214 electrostatically shields the scrivener electrode 212 from electrostatic interaction with an electric field exterior to the nanopore 280.

3. The molecular scrivener 200 of claim 2, further comprising a second power source 238 in electrical communication with the first power source 236 and the second shielding electrode 218 and that:

provides a second potential to the second shielding electrode 218 such that the second shielding electrode 218 electrostatically shields the scrivener electrode 212 from electrostatic interaction with electric fields exterior to the nanopore 280, wherein the first power source 236 receives the second potential from the second power source 238 and provides the first potential referenced to the second potential.

4. The molecular scrivener 200 of claim 3, further comprising a detector 240 in electrical communication with the scrivener electrode 212 and that:

receives the third potential from the scrivener electrode 212; and produces an electrical signal wherein a logarithm of an electrical current in the electrical signal is proportional to the third potential from the scrivener electrode 212.

5. The molecular scrivener 200 of claim 4, wherein the detector 240 comprises a field effect transistor that comprises:

a gate electrode 242 in electrical communication with the scrivener electrode 212 and that receives the third potential from the scrivener electrode 212; and a drain electrode 244 and a source electrode 246 that communicate the electrical current such that an amount of the electrical current is proportional to the third potential received at the gate electrode 242 from the scrivener electrode 212.

6. The molecular scrivener 200 of claim 1, further comprising:

a first writing electrode 212B disposed on the first shielding electrode 214 and that receives a fourth potential;

a second writing electrode 212C disposed on the first shielding electrode 214 and that receives a fifth potential, such that the first writing electrode and the second writing electrode:

bound the nanopore 280 and are opposingly disposed on opposite sides of the nanopore 280;

change a charge of a moiety in the nanopore 280 between the first writing electrode and the second writing electrode when the fourth potential is different from the fifth potential;

a third shielding electrode 214B disposed on the first writing electrode and the second writing electrode and comprising an electrode aperture, the electrode aperture bounding the nanopore to receive the macromolecule and to communicate the macromolecule to the first shielding electrode after passing between the first writing electrode and the second writing electrode, such that the first writing electrode and the second writing electrode are interposed between the third shielding electrode 214B and the first shielding electrode; and a third dielectric layer 226 comprising a dielectric aperture that bounds the nanopore, the third dielectric layer being interposed between:

the first shielding electrode 214 and the third shielding electrode, the first shielding electrode 214 and each of the first writing electrode and the second writing electrode, and the third shielding electrode 214B and each of the first writing electrode and the second writing electrode, such that the third dielectric layer 226 electrically insulates from one another the first shielding electrode, the third shielding electrode, the first writing electrode, and the second writing electrode.

7. The molecular scrivener 200 of claim 6, further comprising:

a write power source in electrical communication with the first writing electrode and the second writing electrode and that:

provides the fourth potential to the first writing electrode; and provides the fifth potential to the second writing electrode.

8. The molecular scrivener 200 of claim 7, further comprising a field effect transistor that comprises:

a gate electrode 242 in electrical communication with the scrivener electrode 212 and that receives the third potential from the scrivener electrode 212; and a drain electrode 244 and a source electrode 246 that communicate the electrical current such that an amount of the electrical current is proportional to the third potential received at the gate electrode 242 from the scrivener electrode 212.

9. The molecular scrivener 200 of claim 8, further comprising:

a container that comprises:

a first compartment that bounds a supply volume that is:

in fluid communication with the nanopore and the third shielding electrode; and provides the macromolecule disposed in the first compartment to the nanopore; and a second compartment that bounds a receiver volume and that is:

in fluid communication with the nanopore and the second shielding electrode; and receives the macromolecule from the nanopore;

a first control electrode disposed in the first compartment and that imparts a transmissive force on the macromolecule disposed in the first compartment to communicate the macromolecule from the first compartment to the nanopore; and a second control electrode disposed in the second compartment and that imparts the transmissive force in the nanopore to communicate the macromolecule from the nanopore to the second compartment.

10. The molecular scrivener 200 of claim 6, wherein the scrivener electrode 212, the first writing electrode, and the second writing electrode independently comprise an atomically-thin electrically conductive membrane or a metal.

11. The molecular scrivener 200 of claim 10, wherein the atomically thin electrically conductive membrane comprises graphene.

12. The molecular scrivener 200 of claim 10, wherein a thickness of the first shielding electrode, the second shielding electrode 218, the third shielding electrode, the first writing electrode, the second writing electrode, the first dielectric layer, the second dielectric layer, and the third dielectric layer independently is from 3.4 Å to 3 nm.

13. The molecular scrivener 200 of claim 1, wherein the macromolecule comprises a plurality of nucleic acid bases, a polymer comprising a plurality of charge moieties or dipolar moieties disposed along a backbone of the polymer, or a combination comprising a combination of the nucleic acid bases and the polymer.

14. A process for reading data from or writing data to a macromolecule with the molecular scrivener of claim 1, the process comprising:

receiving the macromolecule in the nanopore at the first shielding electrode, the macromolecule comprising a plurality of moieties, wherein the moieties comprise a neutral moiety, a charged moiety, a dipolar moiety, or a combination comprising at least one of the foregoing moieties;

electrostatically shielding the scrivener electrode with the first shielding electrode and the second shielding electrode;

communicating, in the nanopore, the macromolecule from the first shielding electrode to the scrivener electrode;

sequentially receiving, in the nanopore at the scrivener electrode, individual moieties of the macromolecule so that the third potential of the scrivener electrode responds to individual moieties in the macromolecule by:

electrically floating, in an absence of a charged moiety or a dipolar moiety of the macromolecule, the scrivener electrode at the third potential such that the third potential is intermediate between the first potential and the second potential;

changing, in a presence of the charged moiety 224 of the macromolecule 210, the third potential V3 from the intermediate potential to electrically read the presence of the charged moiety 224; and changing, in a presence of the dipolar moiety 225 of the macromolecule 210, the third potential from the intermediate potential to electrically read the presence of the dipolar moiety 225;

communicating, in the nanopore, the macromolecule from the scrivener electrode to the second shielding electrode; and communicating the macromolecule from the nanopore at the second shielding electrode to expel the macromolecule from the nanopore.

15. A process for reading data from or writing data to a macromolecule with the molecular scrivener of claim 6, the process comprising:

receiving the macromolecule in the nanopore at the third shielding electrode, the macromolecule comprising a plurality of moieties, wherein the moieties comprise a neutral moiety, a charged moiety, a dipolar moiety, or a combination comprising at least one of the foregoing moieties;

electrostatically shielding the first writing electrode and second writing electrode with the third shielding electrode and the first shielding electrode;

communicating, in the nanopore, the macromolecule from the third shielding electrode to between the first writing electrode and the second writing electrode;

sequentially receiving, in the nanopore between the first writing electrode and the second writing electrode, individual moieties of the macromolecule;

communicating the macromolecule from the first writing electrode and the second writing electrode to the scrivener electrode through the nanopore in the first shielding electrode;

shielding the scrivener electrode by the first shielding electrode and the second shielding electrode;

receiving, in the nanopore at the scrivener electrode, individual moieties of the macromolecule, so that the third potential of the scrivener electrode responds to individual moieties in the macromolecule by:

electrically floating, in an absence of the charged moiety 224 or the dipolar moiety 225 of the macromolecule 210, the scrivener electrode at the third potential such that the third potential V3 is intermediate between the first potential V1 and the second potential V2;

changing, in a presence of the charged moiety 224 of the macromolecule 210, the third potential V3 from the intermediate potential to electrically read the presence of the charged moiety 224; and changing, in a presence of the dipolar moiety 225 of the macromolecule 210, the third potential from the intermediate potential to electrically read the presence of the dipolar moiety 225;

communicating the macromolecule from the nanopore at the scrivener electrode to the nanopore at the second shielding electrode; and communicating the macromolecule from the nanopore at the second shielding electrode to expel the macromolecule from the nanopore.

16. The process of claim 15, wherein the scrivener electrode 212, the first writing electrode, and the second writing electrode independently comprise an atomically-thin electrically conductive membrane comprising graphene or a metal, a thickness of the first shielding electrode, the second shielding electrode 218, the scrivener electrode, the first dielectric layer, and the second dielectric layer independently is from 3.4 Å to 3 nm.

17. The process of claim 15, further comprising, when sequentially receiving, in the nanopore between the first writing electrode and the second writing electrode, individual moieties of the macromolecule:

producing, by the first writing electrode and the second writing electrode, a writing potential by:

receiving, by the first writing electrode, a fourth potential; and receiving, by the second writing electrode, a fifth potential, wherein the writing potential is a potential difference between the fourth potential and the fifth potential;

subjecting a first moiety of the macromolecule to the writing potential;

changing a charge of the first moiety of the macromolecule in response to the writing potential;

communicating the first moiety from the first writing electrode and the second writing electrode to the scrivener electrode; and changing the third potential of the scrivener electrode to detect the first moiety by the scrivener electrode if the first moiety, after changing the charge of the first moiety by the writing potential, is charged or dipolar.

18. The process of claim 15, wherein the scrivener electrode 212, the first writing electrode, and the second writing electrode independently comprise an atomically-thin electrically conductive membrane or a metal.

19. The process of claim 18, wherein the atomically thin electrically conductive membrane comprises graphene.

20. The process of claim 10, wherein a thickness of the first shielding electrode, the second shielding electrode 218, the third shielding electrode, the first writing electrode, the second writing electrode, the scrivener electrode, the first dielectric layer, the second dielectric layer, and the third dielectric layer independently is from 0.34 nm to 3 nm.

* * * * *